(12) United States Patent
Wang

(10) Patent No.: US 12,531,470 B2
(45) Date of Patent: Jan. 20, 2026

(54) POWER SWITCHING CIRCUIT AND CONTROL METHOD THEREOF

(71) Applicant: Delta Electronics (Shanghai) Co., Ltd., Shanghai (CN)

(72) Inventor: Xiaolei Wang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 222 days.

(21) Appl. No.: 18/424,987

(22) Filed: Jan. 29, 2024

(65) Prior Publication Data

US 2025/0149972 A1    May 8, 2025

(30) Foreign Application Priority Data

Nov. 8, 2023 (CN) .......................... 202311484964.3

(51) Int. Cl.
*H02M 1/08* (2006.01)
*H02M 1/088* (2006.01)

(52) U.S. Cl.
CPC .............. *H02M 1/08* (2013.01); *H02M 1/088* (2013.01)

(58) Field of Classification Search
CPC ...... H02M 1/08; H02M 1/0058; H02M 1/327; H02M 1/088; H02M 3/07; H02M 1/0003; H03K 17/122; H03K 17/163
See application file for complete search history.

(56) References Cited

U.S. PATENT DOCUMENTS

| | | | | |
|---|---|---|---|---|
| 10,673,432 | B1* | 6/2020 | Kaya | H02M 3/158 |
| 12,334,825 | B2* | 6/2025 | Nöbauer | H02M 1/088 |
| 2006/0006853 | A1* | 1/2006 | Thiery | H02M 1/088 |
| | | | | 323/276 |
| 2019/0229722 | A1* | 7/2019 | Dubois | H02M 1/088 |
| 2020/0389168 | A1* | 12/2020 | Lee | H03K 17/74 |
| 2024/0204774 | A1* | 6/2024 | Zhu | H03K 17/122 |

FOREIGN PATENT DOCUMENTS

| | | |
|---|---|---|
| CN | 106160424 B | 4/2019 |
| CN | 111508953 A | 8/2020 |

* cited by examiner

*Primary Examiner* — Kyle J Moody
(74) *Attorney, Agent, or Firm* — KIRTON McCONKIE; Evan R. Witt

(57) ABSTRACT

A power switching circuit includes a driving signal part, a first switch element, a second switch element, a first driving circuit and a second driving circuit. The first driving circuit includes a first resistor and a first connection branch, which are connected between a positive driving signal terminal of the driving signal part and a first driving terminal of the first switch element, respectively. The second driving circuit includes a third resistor and a second connection branch, which are connected between the positive driving signal terminal and the second driving terminal of the second switch element, respectively. In a same switching cycle, the turn-on time of the first switch element is earlier than the turn-on time of the second switch element and the turn-off time of the first switch element is earlier than the turn-off time of the second switch element.

23 Claims, 17 Drawing Sheets

A first driving circuit comprising a first resistor and a first connection branch is provided, wherein the first resistor and the first connection branch are connected between the positive driving signal terminal and a first driving terminal of the first switch element, respectively, and the first connection branch comprises a second resistor. — S1

A second driving circuit comprising a third resistor and a second connection branch is provided, wherein the third resistor and the second connection branch are connected between the positive driving signal terminal and the second driving terminal of the second switch element, respectively, and the second connection branch comprises a fourth resistor and a first diode. — S2

In a same switching cycle, when the input current is a positive current or the input voltage is a positive voltage, the turn-on time of the first switch element is earlier than the turn-on time of the second switch element through the first driving circuit and the second driving circuit, when the input current is a negative current or the input voltage is a negative voltage or zero, the turn-off time of the first switch element is earlier than the turn-off time of the second switch element through the first driving circuit and the second driving circuit. — S3

FIG. 10

POWER SWITCHING CIRCUIT AND CONTROL METHOD THEREOF

CROSS-REFERENCE TO RELATED APPLICATION

This application claims priority to China Patent Application No. 202311484964.3, filed on Nov. 8, 2023, the entire content of which is incorporated herein by reference for all purposes.

FIELD OF THE INVENTION

The present disclosure relates to power electronic technology filed, and more particularly to a power switching circuit and a control method of the power switching circuit.

BACKGROUND OF THE INVENTION

As the power level of the switching power supply increases, the power requirements of the power switching circuit used to control the switching power supply also increase. Consequently, the flowing capacity, the switching speed and the heat dissipation capacity of the switch elements in the power switching circuit need to be improved.

In order to meet the power requirements, the power switching circuit usually includes a plurality of switch elements. These switch elements are connected in parallel. Consequently, the total loss of the power switching circuit is reduced, and the heat dissipation capacity is improved.

However, when the plurality of switch elements in the power switching circuit are synchronously turned on or synchronously turned off, a problem associated with the current sharing occurs. For example, the on-resistance distribution of the plurality of switch elements has deviations, or the temperature coefficients are different. Consequently, an inconsistent steady-state current-sharing phenomenon of the switch elements occurs.

In addition, the power loop and the drive loop in the power switching circuit have parasitic inductances, or there are differences in the parasitic resistance, the transconductance value, the distribution deviation of the parasitic capacitance, the distribution deviation of the driving voltage conduction threshold, the temperature coefficient of the driving voltage conduction threshold within the switch elements. Consequently, an inconsistent transient current-sharing phenomenon of the switch elements occurs. Due to the inconsistent steady-state current-sharing phenomenon and the inconsistent transient current-sharing phenomenon of the switch elements in the power switching circuit, the output stability and the lifespan of the switching power supply are low.

Therefore, there is a need of providing an improved power switching circuit in order to overcome the drawbacks of the conventional technologies.

SUMMARY OF THE INVENTION

The present disclosure provides a power switching circuit. The power switching circuit includes a first driving circuit and a second driving circuit. The first driving circuit includes the first resistor and the first connection branch. The first resistor and the first connection branch are connected between a positive driving signal terminal and a first driving terminal of a first switch element, respectively. The second driving circuit includes a third resistor and a second connection branch. The third resistor and the second connection branch are connected between the positive driving signal terminal and a second driving terminal of a second switch element, respectively. Due to the arrangement of the first driving circuit and the second driving circuit, in the same switching cycle, the turn-on time of the first switch element is earlier than the turn-on time of the second switch element, and the turn-off time of the first switch element is earlier than the turn-off time of the second switch element. In the transient state when the switch elements of the power switching circuit are turned on or turned off, the inconsistent transient current-sharing phenomenon is avoided. Consequently, the switching loss and turn-off loss are respectively distributed to the two switch elements. Consequently, the loss and temperature of the two switching elements can be reduced. In this way, the output stability and lifespan of the overall power switching circuit are enhanced, the power density is increased, and the installation cost is reduced.

In accordance with an aspect of the present disclosure, a power switching circuit is provided. The power switching circuit includes a driving signal part, a first switch element, a second switch element, a first driving circuit and a second driving circuit. The driving signal part receives an input current or an input voltage. The driving signal part includes a positive driving signal terminal and a negative driving signal terminal. The second switch element is connected with the first switch element in parallel. The first driving circuit includes a first resistor and a first connection branch. The first resistor and the first connection branch are connected between the positive driving signal terminal and a first driving terminal of the first switch element, respectively. The first connection branch includes a second resistor. The second driving circuit includes a third resistor and a second connection branch. The third resistor and the second connection branch are connected between the positive driving signal terminal and a second driving terminal of the second switch element, respectively. The second connection branch includes a fourth resistor and a first diode. In a same switching cycle, when the input current is a positive current or the input voltage is a positive voltage, the turn-on time of the first switch element is earlier than the turn-on time of the second switch element through the first driving circuit and the second driving circuit. When the input current is a negative current or the input voltage is a negative voltage or zero, the turn-off time of the first switch element is earlier than the turn-off time of the second switch element through the first driving circuit and the second driving circuit.

In accordance with another aspect of the present disclosure, a control method for a power switching circuit is provided. The power switching circuit includes a driving signal part, a first switch element and a second switch element. The driving signal part includes a positive driving signal terminal and a negative driving signal terminal. The driving signal part receives an input current and an input voltage. The first switch element and the second switch element are connected in parallel. The control method includes the following steps. Firstly, a first driving circuit is provided. The first driving circuit includes a first resistor and a first connection branch. The first resistor and the first connection branch are connected between the positive driving signal terminal and a first driving terminal of the first switch element, respectively. The first connection branch includes a second resistor. Then, a second driving circuit is provided. The second driving circuit includes a third resistor and a second connection branch. The third resistor and the second connection branch are connected between the positive driving signal terminal and a second driving terminal of the second switch element, respectively. The second connection branch includes a fourth resistor and a first diode. Then, in a same switching cycle, when the input current is a positive current or the input voltage is a positive voltage, the turn-on time of the first switch element is earlier than the turn-on time of the second switch element through the first driving circuit and the second driving circuit. When the input current is a negative current or the input voltage is a negative voltage or zero, the turn-off time of the first switch element is earlier than the turn-off time of the second switch element through the first driving circuit and the second driving circuit.

The above contents of the present disclosure will become more readily apparent to those ordinarily skilled in the art after reviewing the following detailed description and accompanying drawings, in which:

BRIEF DESCRIPTION OF THE DRAWINGS

FIG. 10 is a flowchart of a control method for a power switching circuit according to an embodiment.

DETAILED DESCRIPTION OF THE PREFERRED EMBODIMENT

Figure 1A:
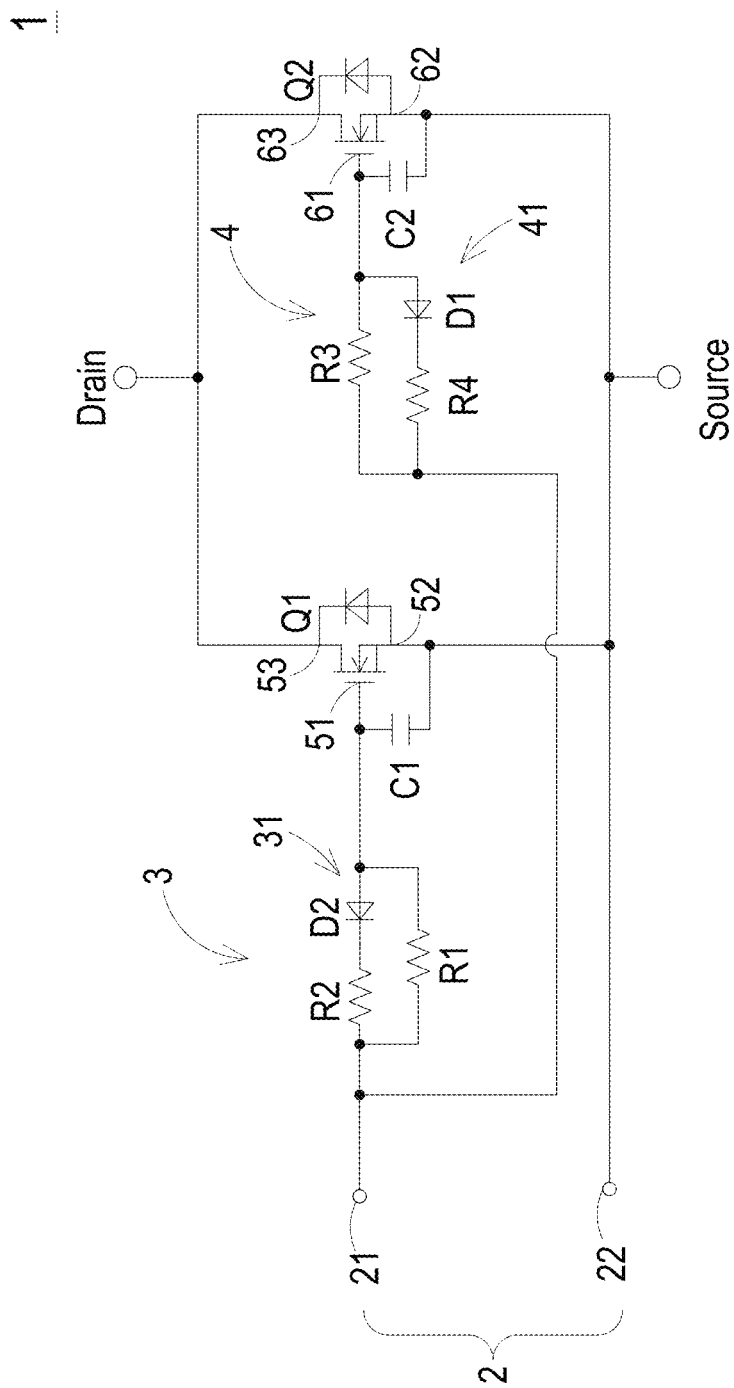
FIG. 1A is a schematic circuit diagram illustrating the circuitry topology of a power switching circuit according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present disclosure and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 1B:
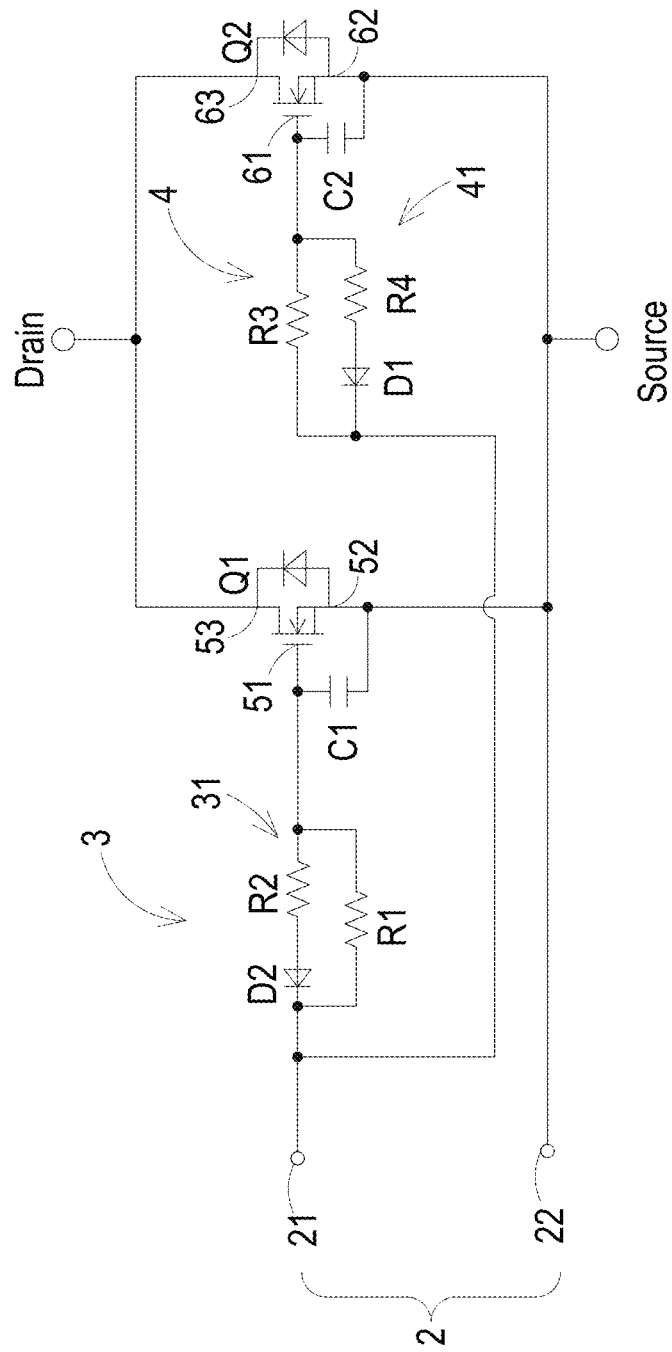
FIG. 1B is a schematic circuit diagram illustrating the circuitry topology of a power switching circuit according to a second embodiment of the present disclosure.
Figure 2A:
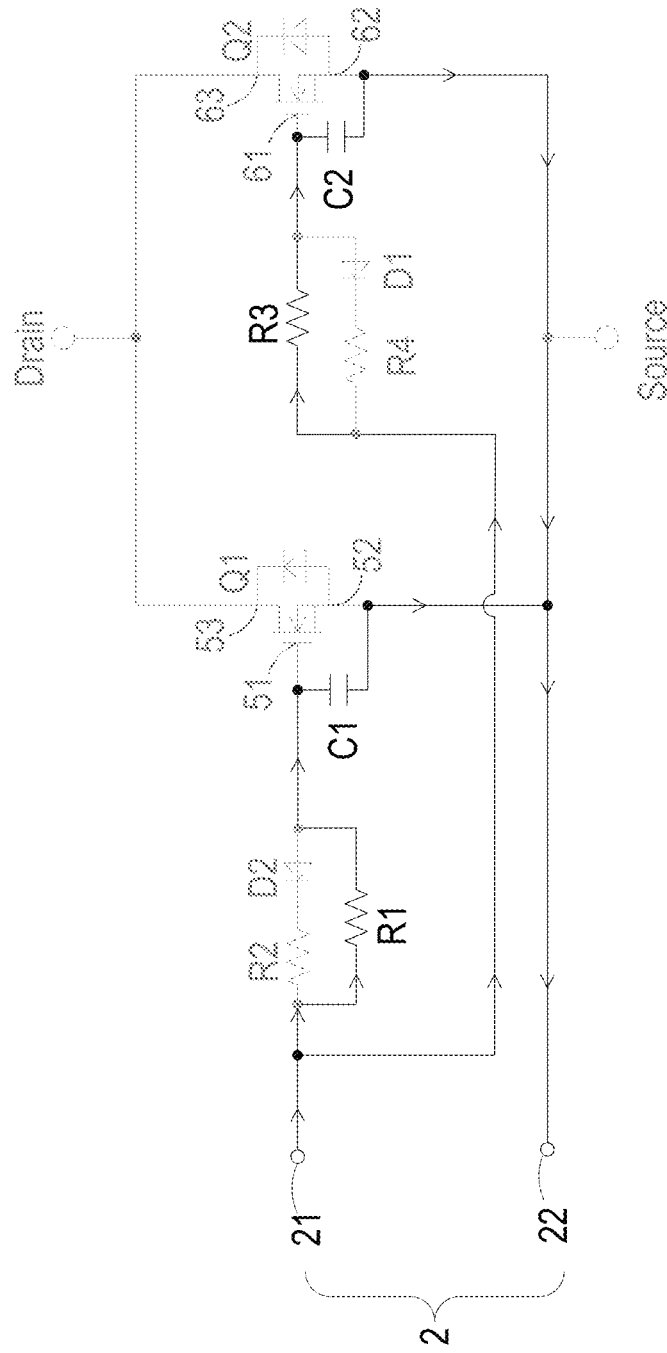
FIG. 2A is a schematic circuit diagram illustrating the current-flowing direction of the power switching circuit in a charging mode.
Figure 2B:
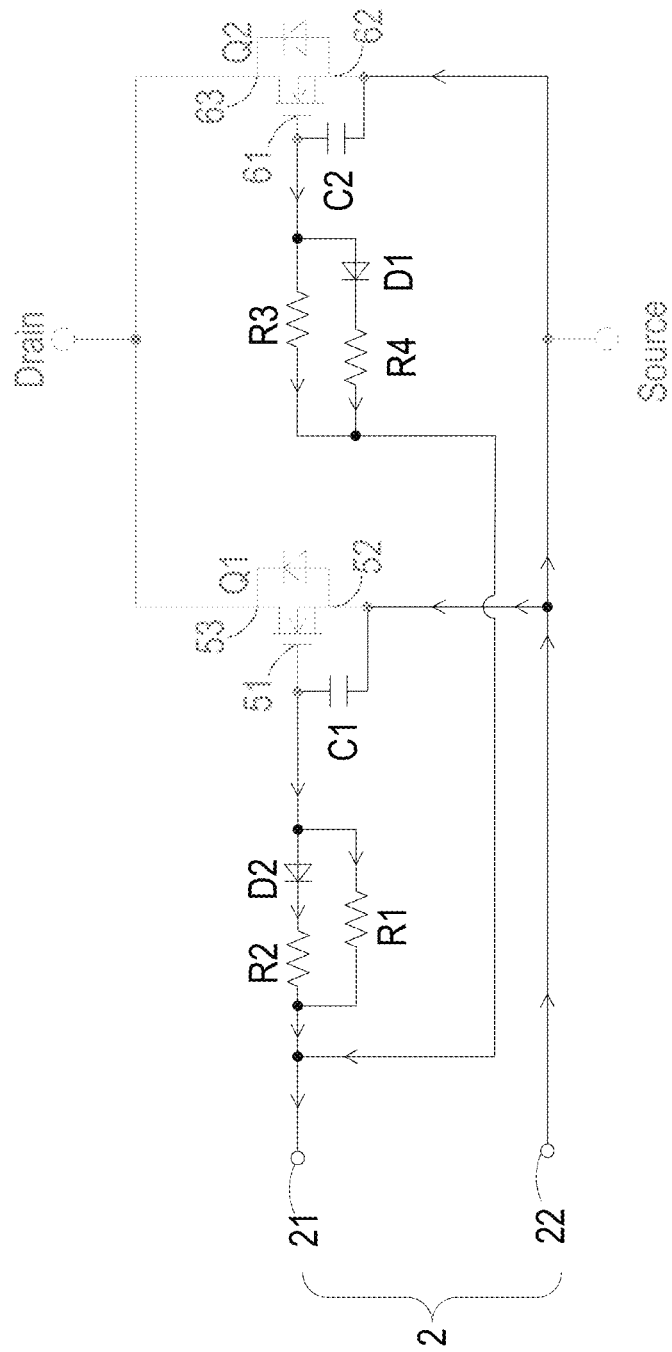
FIG. 2B is a schematic circuit diagram illustrating the current-flowing direction of the power switching circuit in a discharging mode.

Please refer to FIGS. 1A, 1B, 2A and 2B. FIG. 1A is a schematic circuit diagram illustrating the circuitry topology of a power switching circuit according to a first embodiment of the present disclosure. FIG. 1B is a schematic circuit diagram illustrating the circuitry topology of a power switching circuit according to a second embodiment of the present disclosure. FIG. 2A is a schematic circuit diagram illustrating the current-flowing direction of the power switching circuit in a charging mode. FIG. 2B is a schematic circuit diagram illustrating the current-flowing direction of the power switching circuit in a discharging mode. The power switch circuit 1 can be used in a switching power supply. For example, the switching power supply is a high-power vehicle charger or a high-power charging station module.

Please refer to FIG. 1A. In this embodiment, the power switching circuit 1 includes a driving signal part 2, a first switch element Q1, a second switch element Q2, a first driving circuit 3 and a second driving circuit 4. The driving signal part 2 includes a positive driving signal terminal 21 and a negative driving signal terminal 22. The power switching circuit 1 receives an input current or an input voltage through the positive driving signal terminal 21 and the negative driving signal terminal 22.

In one embodiment, the first switch element Q1 is a metal oxide semiconductor field effect transistor (MOSFET) switch. The first switch element Q1 includes a first driving terminal 51 (e.g., a gate terminal), a first conduction terminal 52 (e.g., a source terminal) and a second conduction terminal 53 (e.g., a drain terminal). It is noted that the example of the first switch element Q1 is not restricted. For example, in some other embodiments, the first switch element Q1 is a GaN switch, a SiC switch or an IGBT switch. When the first switch element Q1 is turned on, an inductor current provided by an external inductor (not shown) flows through the first switch element Q1 in the direction from the second conduction terminal 53 to the first conduction terminal 52. As shown in FIG. 1A, the power switching circuit 1 includes a drain terminal (Drain) and a source terminal (Source). In other words, when the first switch element Q1 is turned on, the inductor current flows from the drain terminal (Drain) to the source terminal (Source) through the first switch element Q1. The path of the inductor current is related to a power loop of the power switching circuit 1. The current flowing direction and the control method will be described later.

In this embodiment, the power switching circuit 1 further includes a first total capacitor C1. The first total capacitor C1 is connected between the first driving terminal 51 and the first conduction terminal 52 of the first switch element Q1. The first total capacitor C1 includes a first parasitic capacitor of the first switch element Q1. In some other embodiments, the first total capacitor C1 also includes a first additional capacitor.

In one embodiment, the second switch element Q2 is a metal oxide semiconductor field effect transistor (MOSFET) switch. In addition, the second switch element Q2 is connected with the first switch element Q1 in parallel. The second switch element Q2 includes a second driving terminal 61 (e.g., a gate terminal), a first conduction terminal 62 (e.g., a source terminal) and a second conduction terminal 63 (e.g., a drain terminal). It is noted that the example of the second switch element Q2 is not restricted. For example, in some other embodiments, the second switch element Q2 is a GaN switch, a SiC switch or an IGBT switch. When the second switch element Q2 is turned on, the inductor current provided by the external inductor (not shown) flows through the second switch element Q2 in the direction from the second conduction terminal 63 to the first conduction terminal 62. As shown in FIG. 1A, the power switching circuit 1 includes the drain terminal (Drain) and the source terminal (Source). In other words, when the second switch element Q2 is turned on, the inductor current flows from the drain terminal (Drain) to the source terminal (Source) through the second switch element Q2. The path of the inductor current is related to the power loop of the power switching circuit 1. The current flowing direction and the control method will be described later.

In this embodiment, the power switching circuit 1 further includes a second total capacitor C2. The second total capacitor C2 is connected between the second driving terminal 61 and the first conduction terminal 62 of the second switch element Q2. The second total capacitor C2 includes a second parasitic capacitor of the second switch element Q2. In some other embodiments, the second total capacitor C2 also includes a second additional capacitor.

The first driving circuit 3 includes a first resistor R1 and a first connection branch 31. The first resistor R1 is connected between the positive driving signal terminal 21 of the driving signal part 2 and the first driving terminal 51 of the first switch element Q1. The first connection branch 31 is connected between the positive driving signal terminal 21 of the driving signal part 2 and the first driving terminal 51 of the first switch element Q1. The first connection branch 31 includes a second resistor R2 and a second diode D2. The second resistor R2 and the second diode D2 are serially connected between the positive driving signal terminal 21 of the driving signal part 2 and the first driving terminal 51 of the first switch element Q1. The second resistor R2 is connected between the positive driving signal terminal 21 and the cathode of the second diode D2. The anode of the second diode D2 is connected with the first driving terminal 51 of the first switch element Q1.

In accordance with a feature of the present disclosure, the resistance value of the second resistor R2 is smaller than the resistance value of the first resistor R1. Generally, at the moment when the switch elements Q1 and Q2 are turned on, relatively large noise will be generated. Due to the noise, interference signals are readily generated at the driving terminals 51 and 61 of the switch elements Q1 and Q2, and other switch elements electrically connected with the switch elements Q1 and Q2 are interfered. Consequently, the switch elements may be erroneously turned on. In order to overcome these drawbacks, the turn-on speeds of the switch elements Q1 and Q2 cannot be too fast, and their turn-off speeds can be relatively faster. Since the resistance value of the second resistor R2 is smaller than the resistance value of the first resistor R1, the possibility of erroneously turning on the switch elements Q1 and Q2 of the power switching circuit 1 will be minimized.

The power switching circuit 1 of FIG. 1B is a variant example of the power switching circuit 1 of FIG. 1A. As shown in FIG. 1B, the positions of the second resistor R2 and the second diode D2 in the first connection branch 31 are exchanged when compared with the circuitry topology of FIG. 1A. That is, the cathode of the second diode D2 is connected with the positive driving signal terminal 21, and the second resistor R2 is connected between the anode of the second diode D2 and the first driving terminal 51 of the first switch element Q1.

The second driving circuit 4 includes a third resistor R3 and a second connection branch 41. The third resistor R3 is connected between the positive driving signal terminal 21 of the driving signal part 2 and the second driving terminal 61 of the second switch element Q2. In this embodiment, the resistance value of the third resistor R3 of the second driving circuit 4 is greater than the resistance value of the first resistor R1 of the first driving circuit 3. In addition, the resistance value of the second resistor R2 is smaller than or equal to the fourth resistor R4. The second connection branch 41 is connected between the positive diving signal terminal 21 of the driving signal part 2 and the second driving terminal 61 of the second switch element Q2. In addition, the second connection branch 41 includes the fourth resistor R4 and a first diode D1. The fourth resistor R4 and the first diode D1 are serially connected between the positive driving signal terminal 21 of the driving signal part 2 and the second driving terminal 61 of the second switch element Q2. Moreover, the fourth resistor R4 is connected between the positive driving signal terminal 21 and the cathode of the first diode D1. The anode of the first diode D1 is connected with the second driving terminal 61 of the second switch element Q2.

The resistance value of the fourth resistor R4 is smaller than the resistance value of the third resistor R3. The reason for setting resistance value of the resistors R3 and R4 are identical to the reason for setting resistance value of the resistors R1 and R2. Similarly, in FIG. 1B, the positions of the fourth resistor R4 and the first diode D1 in the second connection branch 41 are exchanged when compared with the circuitry topology of FIG. 1A. That is, the cathode of the first diode D1 is connected with the positive driving signal terminal 21, and the fourth resistor R4 is connected between the anode of the first diode D1 and the first driving terminal 61 of the second switch element Q2.

The operations of the power switching circuit 1 in the charging mode will be described with reference to FIG. 2A. When the input current received by the driving signal part 2 is a positive current, or the potential of the positive driving signal terminal 21 is higher than the potential of the negative driving signal terminal 22 (i.e., the input voltage received by the driving signal part 2 is a positive voltage). Meanwhile, the first total capacitor C1 and the second total capacitor C2 are charged. Under this circumstance, the input current flows through the power switching circuit 1 along two current paths.

In the first current path, the input current flows from the positive driving signal terminal 21 to the negative driving signal terminal 22 through the first resistor R1 and the first total capacitor C1. Consequently, the first total capacitor C1 is charged by the input current. If the voltage of the first total capacitor C1 is higher than a threshold voltage between the first driving terminal 51 and the first conduction terminal 52 of the first switch element Q1, the first switch element Q1 is turned on. When the first switch element Q1 is turned on, the inductor current can flow through the second conduction terminal 53 and the first conduction terminal 52 of the first switch element Q1.

In the second current path, the input current flows from the positive driving signal terminal 21 to the negative driving signal terminal 22 through the third resistor R3 and the second total capacitor C2. Consequently, the second total capacitor C2 is charged by the input current. If the voltage of the second total capacitor C2 is higher than a threshold voltage between the first driving terminal 61 and the first conduction terminal 62 of the second switch element Q2, the second switch element Q2 is turned on. When the second switch element Q2 is turned on, the inductor current can flow through the second conduction terminal 63 and the first conduction terminal 62 of the second switch element Q2.

It is assumed that the capacitance value of the first total capacitor C1 and the capacitance value of the second total capacitor C2 are equal. In an embodiment, the resistance value of the first resistor R1 in the first current path is smaller than the resistance value of the third resistor R3 in the second current path. Consequently, the charging time constant in the first current path (i.e., R1×C1) is smaller than the charging time constant in the second current path (i.e., R2×C2). In other words, the time constant of the resistor and the capacitor corresponding to turning on the first switch element Q1 is smaller than the time constant of the resistor and the capacitor corresponding to turning on the second switch element Q2. Consequently, in the same switching cycle, the turn-on time of the first switch element Q1 in the first current path is earlier than the turn-on time of the second switch element Q2 in the second current path. Due to the fact that when the second switch element Q2 is turned on, the first switch element Q1 has been completely turned on, the second switch element Q2 is turned on in a zero voltage switching manner and almost no turn-on loss is generated.

As mentioned above, the time constant of the resistor and the capacitor corresponding to turning on the first switch element Q1 is smaller than the time constant of the resistor and the capacitor corresponding to turning on the second switch element Q2. Consequently, the charging speed of the first total capacitor C1 is faster than the charging speed of the second total capacitor C2.

The operations of the power switching circuit 1 in the discharging mode will be described with reference to FIG. 2B. When the input current received by the driving signal part 2 is a negative current, or the potential of the positive driving signal terminal 21 is lower than or equal to the potential of the negative driving signal terminal 22 (i.e., the input voltage received by the driving signal part 2 is a negative voltage or zero). Meanwhile, the first total capacitor C1 and the second total capacitor C2 are discharged. Under this circumstance, the input current flows through the power switching circuit 1 along two current paths.

In the first current path, the input current flows from the negative driving signal terminal 22 to the positive driving signal terminal 21 through the first total capacitor C1 and the parallel-connected structure of the first resistor R1 and the first connection branch 31. Consequently, the first total capacitor C1 is discharged. If the voltage of the first total capacitor C1 is lower than the threshold voltage between the first driving terminal 51 and the first conduction terminal 52 of the first switch element Q1, the first switch element Q1 is turned off. When the first switch element Q1 is turned off, the inductor current cannot flow through the second conduction terminal 53 and the first conduction terminal 52 of the first switch element Q1.

In the second current path, the input current flows from the negative driving signal terminal 22 to the positive driving signal terminal 21 through the second total capacitor C2 and the parallel-connected structure of the third resistor R3 and the second connection branch 41. Consequently, the second total capacitor C2 is discharged. If the voltage of the second total capacitor C2 is lower than the threshold voltage between the second driving terminal 61 and the first conduction terminal 62 of the second switch element Q2, the second switch element Q2 is turned off. When the second switch element Q2 is turned off, the inductor current cannot flow through the second conduction terminal 63 and the first conduction terminal 62 of the second switch element Q2.

It is assumed that the capacitance value of the first total capacitor C1 and the capacitance value of the second total capacitor C2 are equal and the voltage drop across the first diode D1 and the voltage drop across the second diode D2 are ignored. In this embodiment, the resistance value of the parallel-connected structure of the first resistor R1 and the second resistor R2 in the first current path is smaller than the resistance value of the parallel-connected structure of the third resistor R3 and the fourth resistor R4 in the second current path. Consequently, the discharging time constant in the first current path (i.e., the resistance value of the parallel-connected structure of the first resistor R1 and the second resistor R2 multiplied by the capacitance value of the first total capacitor C1) is smaller than the discharging time constant in the second current path (i.e., the resistance value of the parallel-connected structure of the third resistor R3 and the fourth resistor R4 multiplied by the capacitance value of the second total capacitor C2). In other words, the time constant of the resistor and the capacitor corresponding to turning off the first switch element Q1 is smaller than the time constant of the resistor and the capacitor corresponding to turning off the second switch element Q2. Consequently, in the same switching cycle, the turn-off time of the first switch element Q1 in the first current path is earlier than the turn-off time of the second switch element Q2 in the second current path. Due to the fact that the first switch element Q1 turns off earlier than the second switch element Q2, the first switch element Q1 is turned off in the zero voltage switching manner and almost no turn-off loss is generated.

As mentioned above, the time constant of the resistor and the capacitor corresponding to turning off the first switch element Q1 is smaller than the time constant of the resistor and the capacitor corresponding to turning off the second switch element Q2. Consequently, the discharging speed of the first total capacitor C1 is faster than the discharging speed of the second total capacitor C2.

Figure 3:
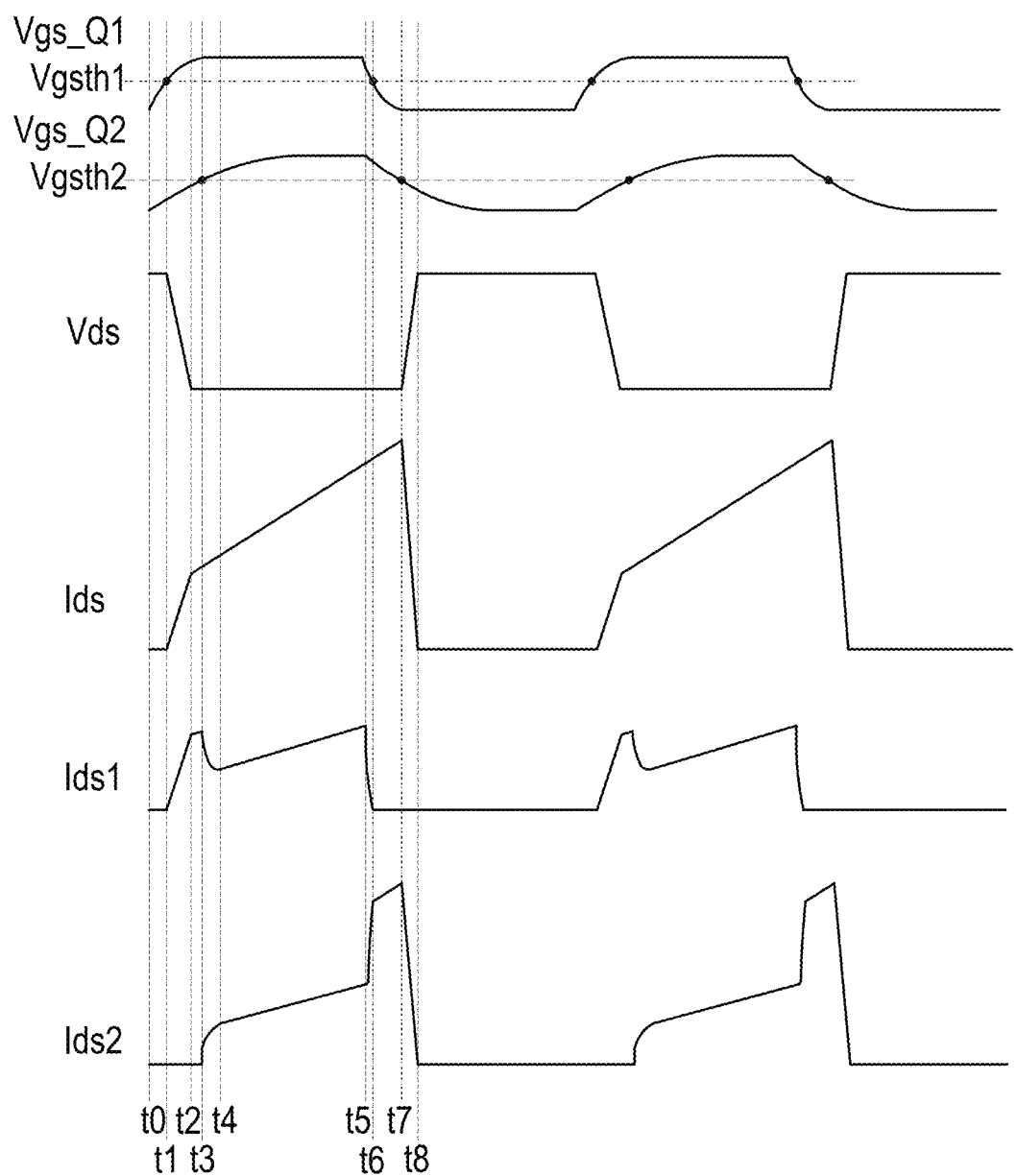
FIG. 3 is a schematic timing waveform diagram illustrating the voltages/currents of associated components in the power switching circuit shown in FIG. 1A.

Please refer to FIGS. 1A, 2A, 2B and 3. FIG. 3 is a schematic timing waveform diagram illustrating the voltages/currents of associated components in the power switching circuit shown in FIG. 1A. In FIG. 3, Vgs_Q1 is the voltage between the first driving terminal 51 and the first conduction terminal 52 of the first switch element Q1, Vgsth1 is both the turning on threshold voltage and the turning off threshold voltage between the first driving terminal 51 and the first conduction terminal 52 of the first switch element Q1, Vgs_Q2 is the voltage between the first driving terminal 61 and the first conduction terminal 62 of the second switch element Q2, Vgsth2 is both the turning on threshold voltage and the turning off threshold voltage between the second driving terminal 61 and the first conduction terminal 62 of the second switch element Q2, and Vds is the voltage difference between the second conduction terminal 53 and the first conduction terminal 52 of the first switch element Q1 or the voltage difference between the second terminal 63 and the first conduction terminal 62 of the second switch element Q2. In addition, Ids is the total current flowing through the first switch element Q1 and the second switch element Q2, Ids1 is the current flowing through the first switch element Q1, and Ids2 is the current flowing through the second switch element Q2.

For illustration, it is assumed that the threshold voltage Vgsth1 between the first driving terminal 51 and the first conduction terminal 52 of the first switch element Q1 and the threshold voltage Vgsth2 between the second driving terminal 61 and the first conduction terminal 62 of the second switch element Q2 are equal. Furthermore, the on-resistance of the first switch element Q1 and the on-resistance of the second switch element Q2 are equal, and the parasitic resistances of the power loop and the driving loop in the power switching circuit 1 are ignored.

In FIG. 3, the time interval between the time point t0 and the time point t8 is a switching cycle. The voltage/current waveforms of some components in the power switching circuit 1 of FIG. 1 will be described as follows.

At the time point t1, the first switch element Q1 and the second switch element Q2 enter a charging stage simultaneously. In this stage, the input current received by the driving signal part 2 is a positive current, or the input voltage received by the driving signal part 2 is a positive voltage.

In the time interval between the time point t0 and the time point t1, the voltage Vgs_Q1 between the first driving terminal 51 and the first conduction terminal 52 of the first switch element Q1 continuously rises, and the voltage Vgs_Q2 between the second driving terminal 61 and the first conduction terminal 62 of the second switch element Q2 continuously rises.

At the time point t1, the voltage Vgs_Q1 between the first driving terminal 51 and the first conduction terminal 52 of the first switch element Q1 is equal to the threshold voltage Vgsth1 between the first driving terminal 51 and the first conduction terminal 52 of the first switch element Q1. In other words, the first switch element Q1 is ready to enter into a linear (partially enhanced) mode.

In the time interval between the time point t1 and the time point t2, the first switch element Q1 enters the liner mode and is experiencing hard switching on. Consequently, the first switch element Q1 is turned on. The voltage Vds between the second conduction terminal 53 and the first conduction terminal 52 of the first switch element Q1 gradually decreases. The total current Ids flowing through the first switch element Q1 and the second switch element Q2 rises to a steady-state initial value. In this time interval, the total current Ids flowing through the first switch element Q1 and the second switch element Q2 is equal to the current Ids1 flowing through the first switch element Q1. In other words, the first switch element Q1 bears all turn-on loss.

In the time interval between the time point t2 and the time point t3, the voltage Vds between the second conduction terminal 53 and the first conduction terminal 52 of the first switch element Q1 is zero. The rising slope of the total current Ids flowing through the first switch element Q1 and the second switch element Q2 decreases. However, the total current Ids is still equal to the current Ids1 flowing through the first switch element Q1.

At the time point t3, the voltage Vgs_Q2 between the second driving terminal 61 and the first conduction terminal 62 of the second switch element Q2 is equal to the threshold voltage Vgsth2 between the second driving terminal 61 and the first conduction terminal 62 of the second switch element Q2. In other words, the second switch element Q2 is ready to enter into a linear (partially enhanced) mode. Which means, the impedance between the second conduction terminal 63 and the first conduction terminal 62 of the second switch element Q2 gradually decreases from infinity.

In the time interval between the time point t3 and the time point t4, the second switch element Q2 enters into the linear mode. Consequently, the second switch element Q2 is turned on. The current Ids2 flowing through the second switch element Q2 gradually increases, and the current Ids1 flowing through the first switch element Q1 gradually decreases.

In the time interval between the time point t4 and the time point t5, the second switch element Q2 is completely turned on. Consequently, the current Ids2 flowing through the second switch element Q2 is equal to the current Ids1 flowing through the first switch element Q1. That is, each of the current Ids1 and the current Ids2 is equal to a half of the total current Ids. The current Ids2 flowing through the second switch element Q2 and the current Ids1 flowing through the first switch element Q1 rise simultaneously.

From the time point t5 or the time point close to t5, the voltage Vgs_Q1 of the first switch element Q1 and the voltage Vgs_Q2 of the second switch element Q2 start to enter a discharging stage simultaneously. In the discharging stage, the input current received by the driving signal unit 2 is a negative current. At the time point t5, the first switch element Q1 cannot be completely turned on and enters the linear mode. In addition, the impedance between the second conduction terminal 53 and the first conduction terminal 52 of the first switch element Q1 gradually increases to infinity.

In the time interval between the time point t5 and the time point t6, the current Ids1 flowing through the first switch element Q1 gradually decreases to zero, and the current Ids2 flowing through the second switch element Q2 gradually increases.

At the time point t6, the voltage Vgs_Q1 between the first driving terminal 51 and the first conduction terminal 52 of the first switch element Q1 starts to be smaller than the threshold voltage Vgsth1 between the first driving terminal 51 and the first conduction terminal 52 of the first switch element Q1. In other words, the first switch element Q1 is completely turned off.

In the time interval between the time point t6 and the time point t7, only the second switch element Q2 is in the on state. Consequently, the current Ids2 flowing through the second switch element Q2 is equal to the total current Ids. The current Ids2 flowing through the second switch element Q2 and the total current Ids rise simultaneously.

At the time point t7, the voltage Vgs_Q2 between the second driving terminal 61 and the first conduction terminal 62 of the second switch element Q2 starts to be smaller than the threshold voltage Vgsth2 between the second driving terminal 61 and the first conduction terminal 62 of the second switch element Q2. The second switch element Q2 enters the linear mode.

In the time interval between the time point t7 and the time point t8, the second switch element Q2 is in the linear mode and experiencing hard switching off. Consequently, the voltage Vds between the second conduction terminal 52 and the first conduction terminal 51 of the first switch element Q1 gradually increases, and the total current Ids decreases to zero. In this time interval, the total current Ids is equal to the current Ids2 flowing through the second switch element Q2, and the second switch element Q2 bears all the turn-off loss. At the time point t8, the second switch element Q2 is completely turned off.

In the time interval between the time point t8 and at the time point t0 of the next switching cycle, the first switch element Q1 and the second switch element Q2 are completely turned off.

From the above descriptions, the power switching circuit 1 includes two driving circuits. The first driving circuit 3 includes the first resistor R1 and the first connection branch 31. The first resistor R1 and the first connection branch 31 are connected between the positive driving signal terminal 21 of the driving signal part 2 and the first driving terminal 51 of the first switch element Q1, respectively. The second driving circuit 4 includes the third resistor R3 and the second connection branch 41. The third resistor R3 and the second connection branch 41 are connected between the positive driving signal terminal 21 of the driving signal part 2 and the first driving terminal 61 of the second switch element Q2, respectively. Due to the arrangement of the first driving circuit 3 and the second driving circuit 4, in the same switching cycle, the turn-on time of the first switch element Q1 is earlier than the turn-on time of the second switch element Q2, and the turn-off time of the first switch element Q1 is earlier than the turn-off time of the second switch element Q2. In other words, in the transient state when the switch elements Q1 and Q2 of the power switching circuit 1 are turned on or turned off, the inconsistent transient current-sharing phenomenon is avoided. Consequently, the switching loss and turn-off loss are respectively distributed to the two switch elements Q1 and Q2. That is, the first switch element Q1 bears all (or most) turn-on loss but does not bear (or bears little) turn-off loss, and the second switch element Q2 bears all (or most) turn-off loss but does not bear (or bears little) turn-on loss. The duration in which the first switch element Q1 is fully turned on is almost the same as the duration in which the second switch element Q2 is fully turned on. Consequently, the loss and temperature of the two switching elements are well balanced. In this way, the output stability and lifespan of the overall power switching circuit 1 are enhanced, the power density is increased, and the installation cost is reduced.

Figure 4A:
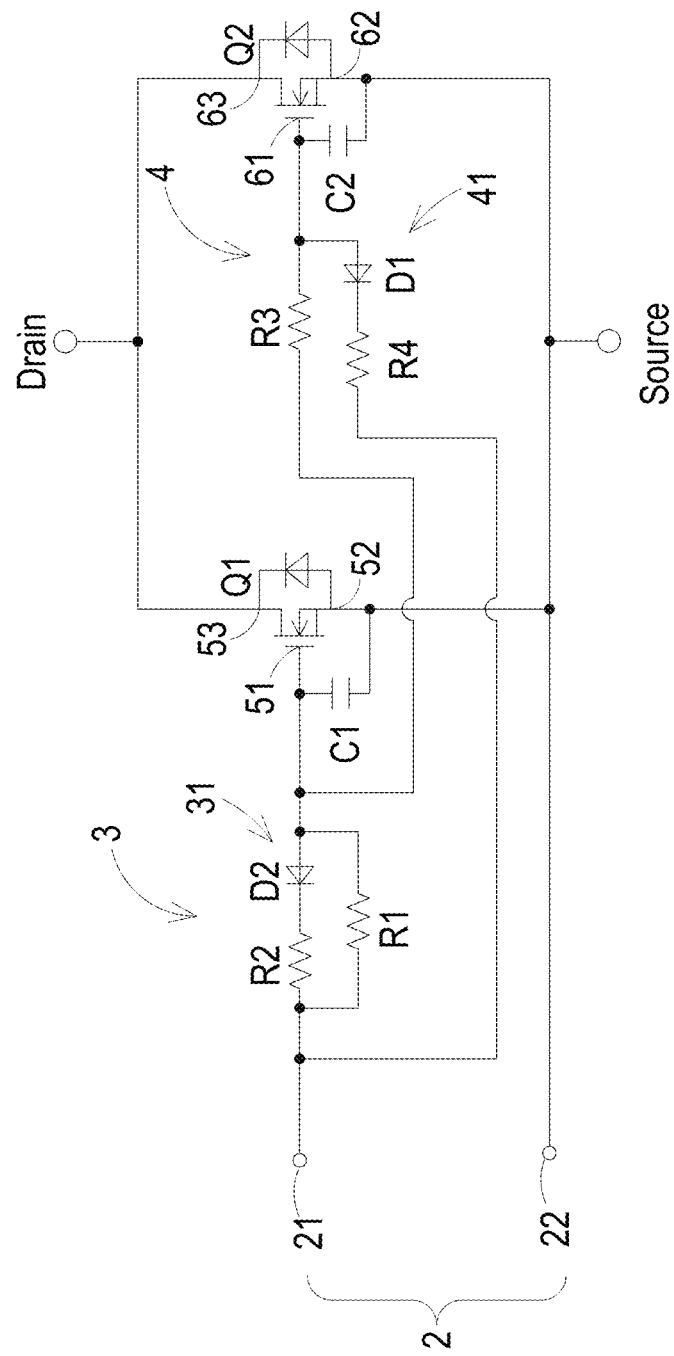
FIG. 4A is a schematic circuit diagram illustrating the circuitry topology of a power switching circuit according to a third embodiment of the present disclosure.

In some embodiments, the relationships between the third resistor R3 and the second connection branch 41 of the second driving circuit 4 and associated components may be varied according to practical requirements. FIG. 4A is a schematic circuit diagram illustrating the circuitry topology of a power switching circuit according to a third embodiment of the present disclosure. The circuitry topology of the power switching circuit 1a, the current flowing directions of the power switching circuit 1a in the charging/discharging modes, the operating principles of the power switching circuit 1a and the voltage/current waveforms are similar to those of the power switching circuit 1 of the first embodiment (e.g., as shown in FIGS. 1A to 3). Component parts and elements corresponding to those of the first embodiment are designated by identical numeral references, and detailed descriptions thereof are omitted.

In comparison with the power switching circuit 1 of FIG. 1A, the relationships between the second driving circuit 4 and associated components in the power switching circuit 1a of FIG. 4A are distinguished. As shown in FIG. 4A, the third resistor R3 is connected between the first driving terminal 51 of the first switch element Q1 and the second driving terminal 61 of the second switch element Q2. Consequently, the positive current received by the driving signal part 2 needs to flow through the first resistor R1 of the first driving circuit 3 before flowing through the second switch element Q2. That is, when the second total capacitor C2 is charged by the input current, the input current flows from the positive driving signal terminal 21 to the negative driving signal terminal 22 through the first resistor R1, the third resistor R3 and the second total capacitor C2 along the second current path. In addition, the negative current received by the driving signal part 2 needs to flow to the positive driving signal terminal 21 through the first driving circuit 3 after flowing through the second switch element Q2. That is, when the second total capacitor C2 is discharged, the input current flows from the negative driving signal terminal 22 to the positive driving signal terminal 21 through the second total capacitor C2 and two branches of a parallel-connected structure along the second current path. That is, a first portion of the input current flows through the third resistor R3 and the first driving circuit 3 along the first branch of the parallel-connected structure, and a second portion of the input current flows through the second connection branch 41 along the second branch of the parallel-connected structure. Consequently, the turn-on time of the first switch element Q1 is earlier than the turn-on time of the second switch element Q2, and the turn-off time of the first switch element Q1 is earlier than the turn-off time of the second switch element Q2.

In case that the input current received by the driving signal part 2 is the positive current or the input voltage received by the driving signal part 2 is the positive voltage, the first current path in the power switching circuit 1a of this embodiment is identical to the first current path in the power switching circuit 1 of the first embodiment. The resistance value of the first resistor R1 in the first current path is smaller than the resistance value of the series-connected structure of the first resistor R1 and the third resistor R3 in the second current path. Consequently, the charging time constant in the first current path (i.e., R1×C1) is smaller than the charging time constant in the second current path (i.e., (R2+R3)×C2). The arrangements of the first total capacitor C1 and the second total capacitor C2 are similar to those of the first embodiment. Consequently, in the same switching cycle, the turn-on time of the first switch element Q1 in the first current path is earlier than the turn-on time of the second switch element Q2 in the second current path.

In case that the input current received by the driving signal part 2 is the negative current or the input voltage received by the driving signal part 2 is the negative voltage or zero, the first current path in the power switching circuit 1a of this embodiment is identical to the first current path in the power switching circuit 1 of the first embodiment. The resistance value of the parallel-connected structure of the first resistor R1 and the second resistor R2 in the first current path is smaller than the resistance value of the parallel-connected structure of the fourth resistor R4 and a series-connected structure of the third resistor R3 and the first driving circuit 3 in the second current path. Consequently, the discharging time constant in the first current path (i.e., the resistance value of the parallel-connected structure of the first resistor R1 and the second resistor R2 multiplied by the capacitance value of the first total capacitor C1) is smaller than the discharging time constant in the second current path (i.e., the resistance value of the parallel-connected structure of the fourth resistor R4 and a series-connected structure of the third resistor R3 and the first driving circuit 3 multiplied by the capacitance value of the second total capacitor C2).

In a variant example, the resistance value of the second resistor R2 is 052. The arrangements of the first total capacitor C1 and the second total capacitor C2 are similar to those of the first embodiment. In addition, the voltage drop across the first diode D1 and the voltage drop across the second diode D2 are ignored. Consequently, in the same switching cycle, the turn-off time of the first switch element Q1 in the first current path is earlier than the turn-off time of the second switch element Q2 in the second current path.

Figure 4B:
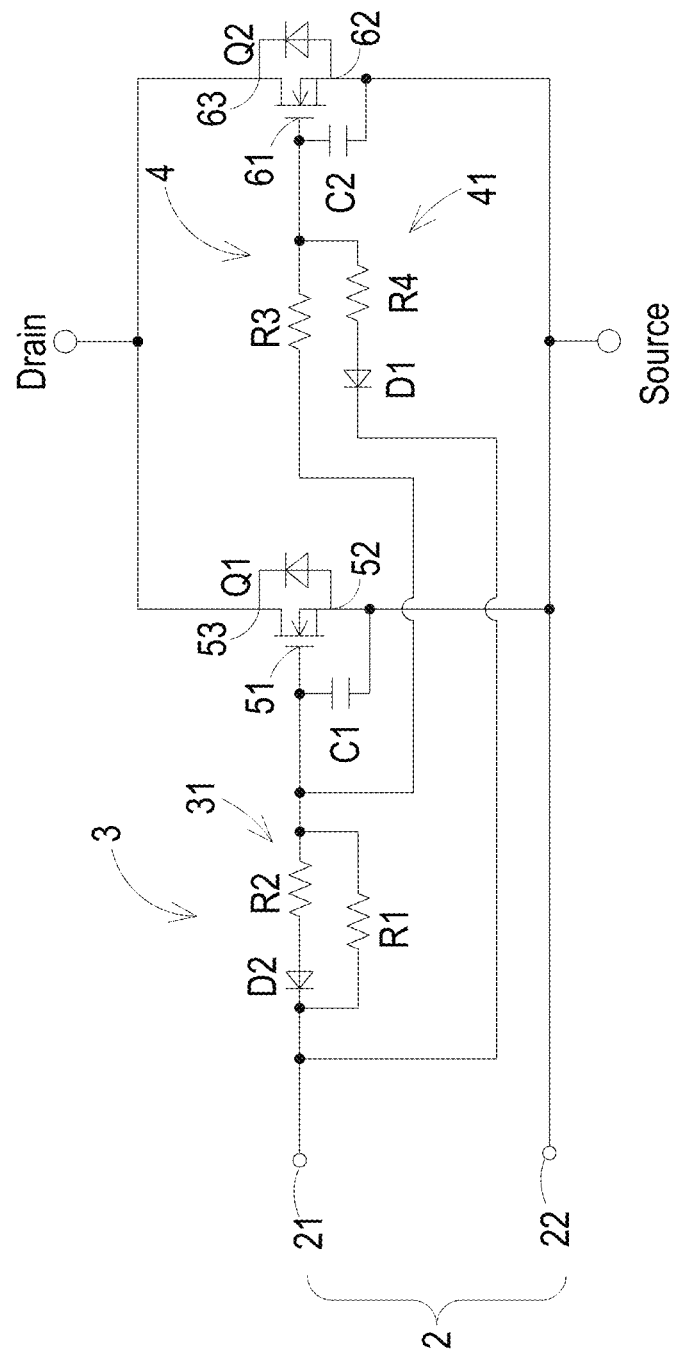
FIG. 4B is a schematic circuit diagram illustrating the circuitry topology of a power switching circuit according to a fourth embodiment of the present disclosure.

FIG. 4B is a schematic circuit diagram illustrating the circuitry topology of a power switching circuit according to a fourth embodiment of the present disclosure. The power switching circuit 1a of FIG. 4B is a variant example of the power switching circuit 1a of FIG. 4A. As shown in FIG. 4B, the positions of the second resistor R2 and the second diode D2 in the first connection branch 31 are exchanged when compared with the circuitry topology of FIG. 4A. That is, the cathode of the second diode D2 is connected with the positive driving signal terminal 21, and the second resistor R2 is connected between the anode of the second diode D2 and the first driving terminal 51 of the first switch element Q1. Similarly, the positions of the fourth resistor R4 and the first diode D1 in the second connection branch 41 are exchanged when compared with the circuitry topology of FIG. 4A. That is, the cathode of the first diode D1 is connected with the positive driving signal terminal 21, and the fourth resistor R4 is connected between the anode of the first diode D1 and the second driving terminal 61 of the second switch element Q2.

Figure 5:
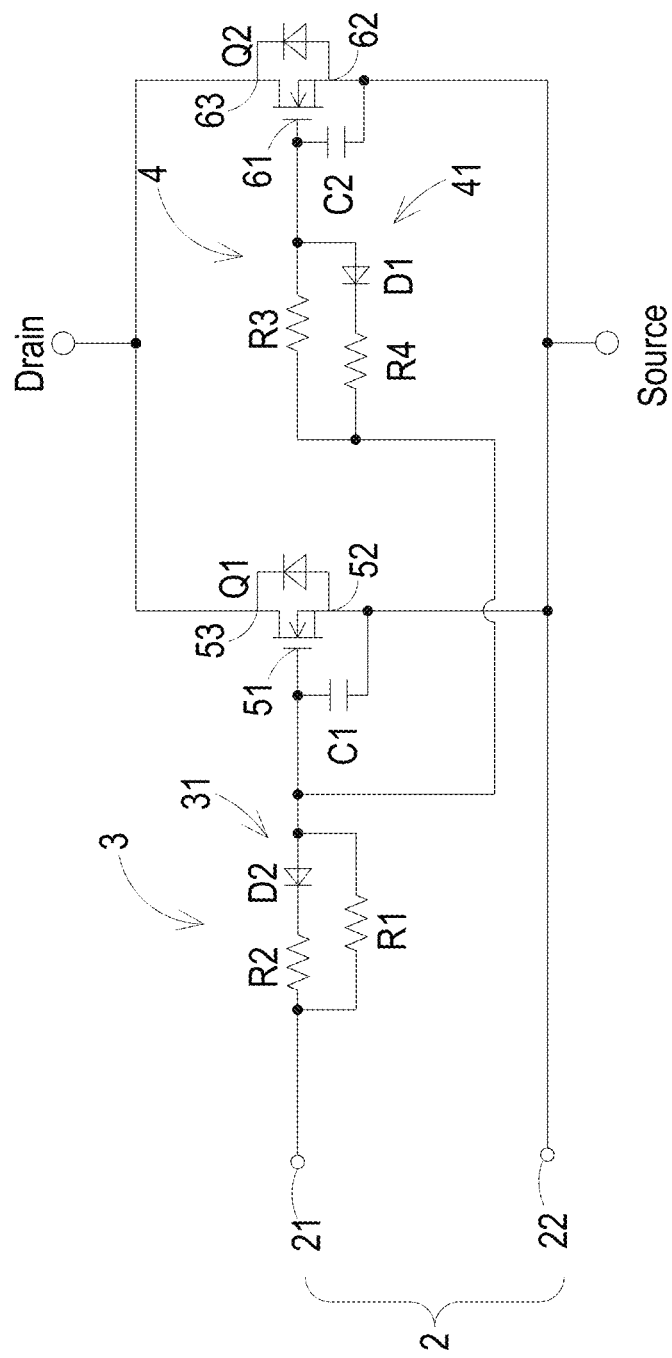
FIG. 5 is a schematic circuit diagram illustrating the circuitry topology of a power switching circuit according to a fifth embodiment of the present disclosure.

FIG. 5 is a schematic circuit diagram illustrating the circuitry topology of a power switching circuit according to a fifth embodiment of the present disclosure. The circuitry topology of the power switching circuit 1b, the current flowing directions of the power switching circuit 1b in the charging/discharging modes, the operating principles of the power switching circuit 1b and the voltage/current waveforms are similar to those of the power switching circuit 1 of the first embodiment (e.g., as shown in FIGS. 1A to 3). Component parts and elements corresponding to those of the first embodiment are designated by identical numeral references, and detailed descriptions thereof are omitted.

In comparison with the power switching circuit 1 of FIG. 1A, the relationships between the second driving circuit 4 and associated components in the power switching circuit 1b of FIG. 5 are distinguished. As shown in FIG. 5, the third resistor R3 is connected between the first driving terminal 51 of the first switch element Q1 and the second driving terminal 61 of the second switch element Q2. In addition, the fourth resistor R4 and the first diode D1 of the second connection branch 41 are connected between the first driving terminal 51 of the first switch element Q1 and the second driving terminal 61 of the second switch element Q2. That is, the fourth resistor R4 is connected between the first driving terminal 51 of the first switch element Q1 and the cathode of the first diode D1, and the anode of the first diode D1 is connected with the second driving terminal 61 of the second switch element Q2. It is noted that the positions of the first diode D1 and the fourth resistor R4 may be exchanged. That is, the cathode of the first diode D1 is connected with the first driving terminal 51 of the first switch element Q1, and the fourth resistor R4 is connected between the anode of the first diode D1 and the second driving terminal 61 of the second switch element Q2 (similar to FIGS. 1A and 1B, exchange the positions of the first diode D1 and the fourth resistor R4).

Consequently, the positive current received by the driving signal part 2 needs to flow through the first resistor R1 of the first driving circuit 3 before flowing through the second switch element Q2. That is, when the second total capacitor C2 is charged, the input current flows from the positive driving signal terminal 21 to the negative driving signal terminal 22 through the first resistor R1, the third resistor R3 and the second total capacitor C2 along the second current path.

In addition, the negative current received by the driving signal part 2 needs to flow to the positive driving signal terminal 21 through the first driving circuit 3 after flowing through the second switch element Q2. That is, when the second total capacitor C2 is discharged, the input current flows from the negative driving signal terminal 22 to the positive driving signal terminal 21 through the second total capacitor C2, the parallel-connected structure of the second connection branch 41 and the third resistor R3 and the parallel-connected structure of the first connection branch 31 and the first resistor R1 along the second current path. Consequently, the turn-on time of the first switch element Q1 is earlier than the turn-on time of the second switch element Q2, and the turn-off time of the first switch element Q1 is earlier than the turn-off time of the second switch element Q2.

In case that the input current received by the driving signal part 2 is the positive current or the input voltage received by the driving signal part 2 is the positive voltage, the first current path in the power switching circuit 1b of this embodiment is identical to the first current path in the power switching circuit 1 of the first embodiment. The resistance value of the first resistor R1 in the first current path is smaller than the resistance value of the series-connected structure of the first resistor R1 and the third resistor R3 in the second current path. Consequently, the charging time constant in the first current path (i.e., R1×C1) is smaller than the charging time constant in the second current path (i.e., (R1+R3)×C2).

The arrangements of the first total capacitor C1 and the second total capacitor C2 are similar to those of the first embodiment. Consequently, in the same switching cycle, the turn-on time of the first switch element Q1 in the first current path is earlier than the turn-on time of the second switch element Q2 in the second current path.

In case that the input current received by the driving signal part 2 is the negative current or the input voltage received by the driving signal part 2 is the negative voltage or zero, the first current path in the power switching circuit 1b of this embodiment is identical to the first current path in the power switching circuit 1 of the first embodiment. The resistance value of the first driving circuit 31 in the first current path is lower than the resistance value of the series-connected structure of the first driving circuit 31 and the second driving circuit 32. Consequently, the discharging time constant in the first current path (i.e., the resistance value of the parallel-connected structure of the first resistor R1 and the second resistor R2 multiplied by the capacitance value of the first total capacitor C1) is smaller than the discharging time constant in the second current path (i.e., the resistance value of the parallel-connected structure of the first resistor R1 and the second resistor R2 and the resistance value of the parallel-connected structure of the third resistor R3 and the fourth resistor R4 are added together and multiplied by the capacitance value of the second total capacitor C2). The arrangements of the first total capacitor C1 and the second total capacitor C2 are similar to those of the first embodiment, and the voltage drop across the first diode D1 and the voltage drop across the second diode D2 are ignored. Consequently, in the same switching cycle, the turn-off time of the first switch element Q1 in the first current path is earlier than the turn-off time of the second switch element Q2 in the second current path.

Figure 6A:
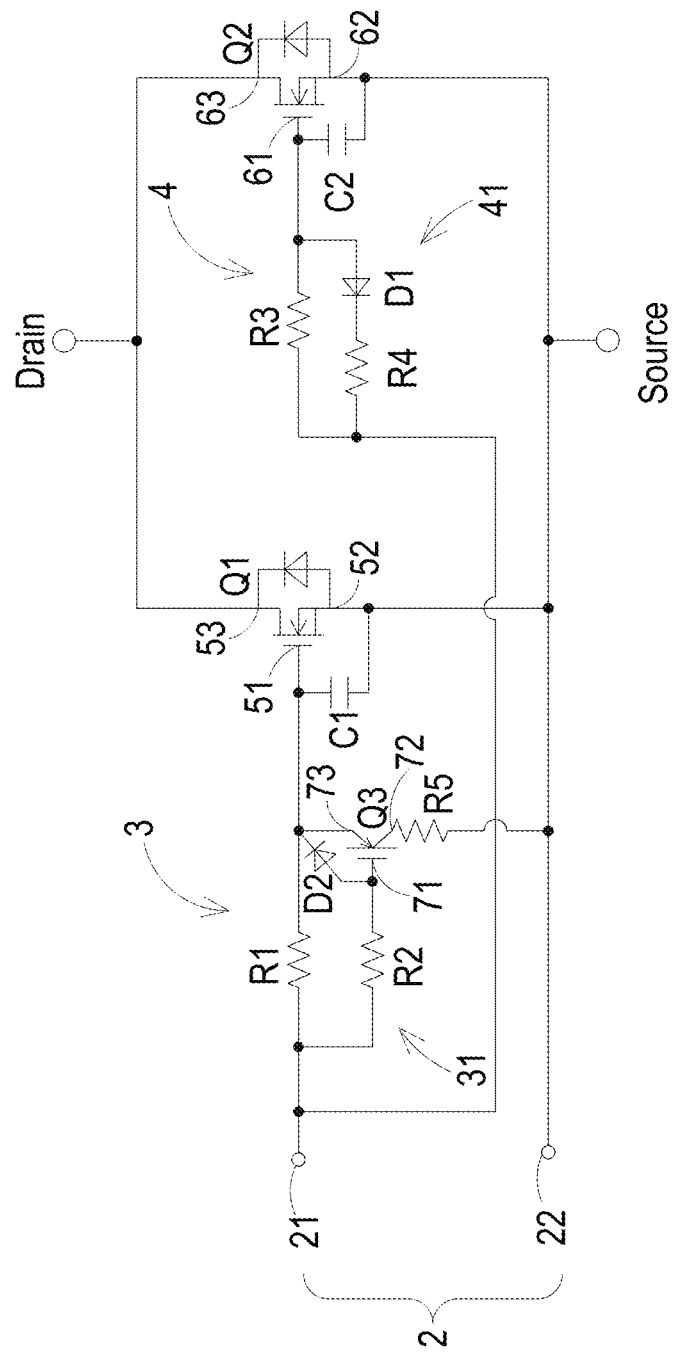
FIG. 6A is a schematic circuit diagram illustrating the circuitry topology of a power switching circuit according to a sixth embodiment of the present disclosure.
Figure 7A:
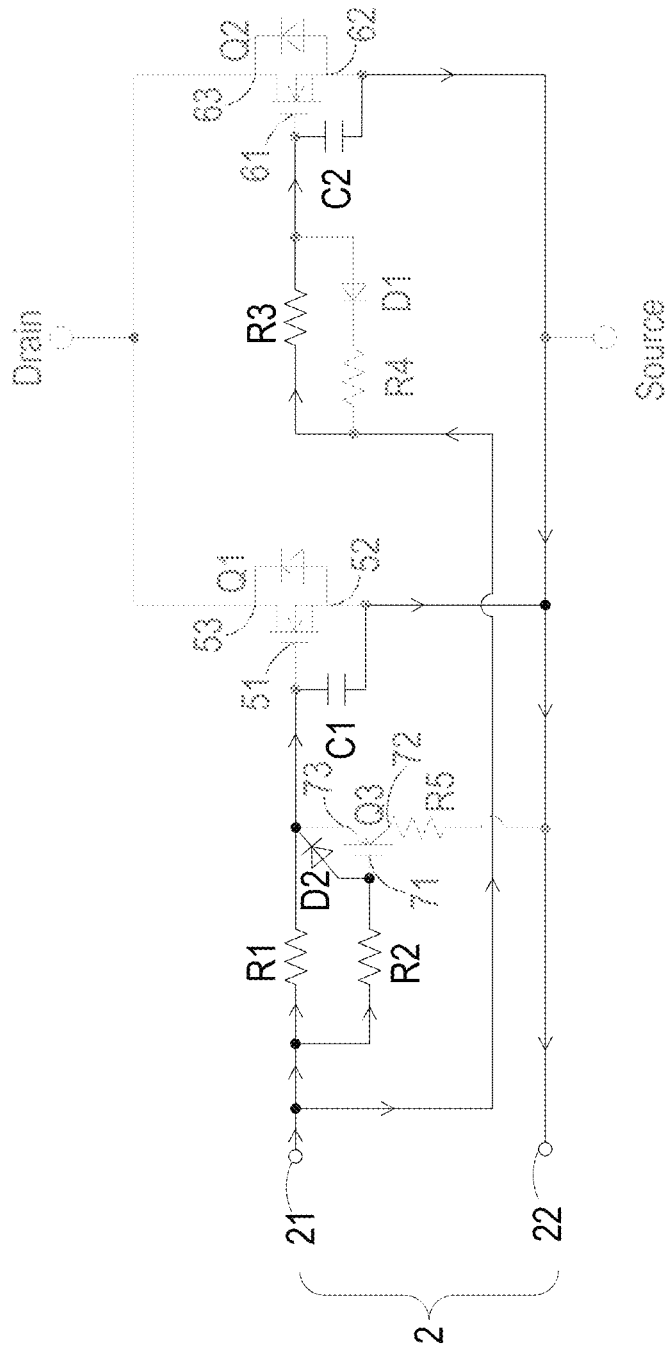
FIG. 7A is a schematic circuit diagram illustrating the current-flowing direction of the power switching circuit in a charging mode.
Figure 7B:
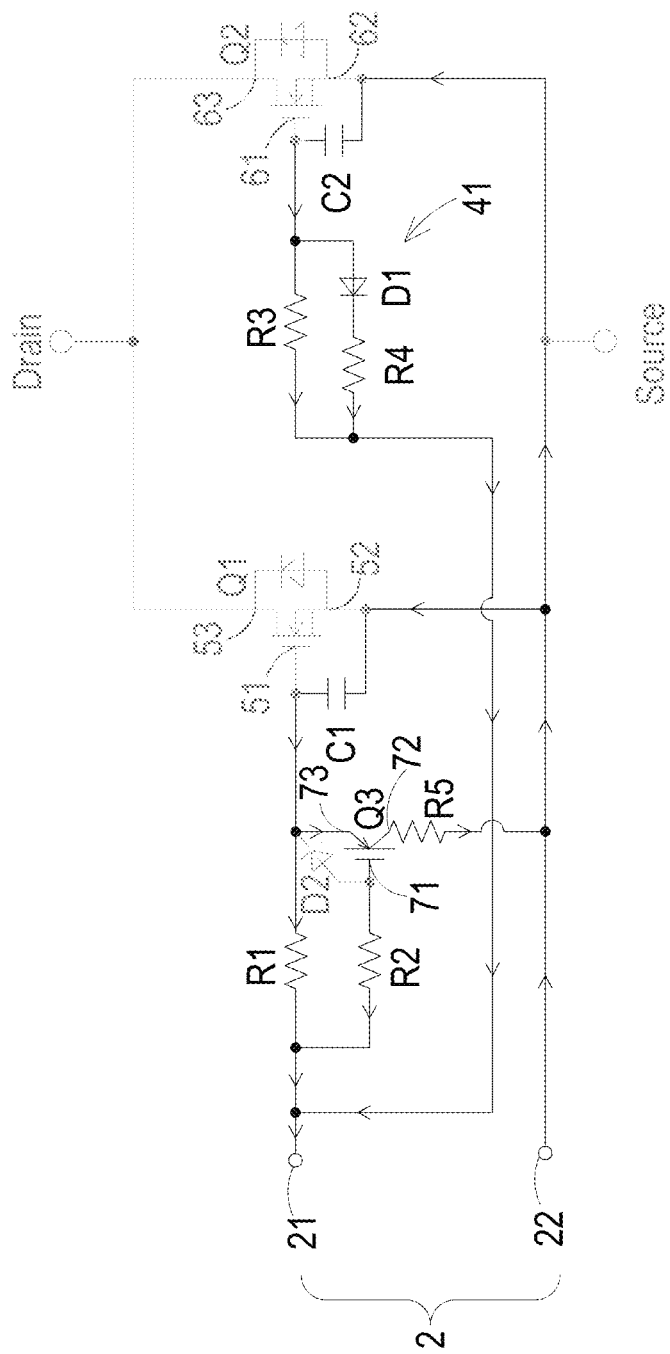
FIG. 7B is a schematic circuit diagram illustrating the current-flowing direction of the power switching circuit in a discharging mode.

FIG. 6A is a schematic circuit diagram illustrating the circuitry topology of a power switching circuit according to a sixth embodiment of the present disclosure. FIG. 7A is a schematic circuit diagram illustrating the current-flowing direction of the power switching circuit in a charging mode. FIG. 7B is a schematic circuit diagram illustrating the current-flowing direction of the power switching circuit in a discharging mode. The circuitry topology of the power switching circuit 1c, the current flowing directions of the power switching circuit 1c in the charging/discharging modes, the operating principles of the power switching circuit 1c and the voltage/current waveforms are similar to those of the power switching circuit 1 of the first embodiment (e.g., as shown in FIGS. 1A to 3). Component parts and elements corresponding to those of the first embodiment are designated by identical numeral references, and detailed descriptions thereof are omitted.

In comparison with the power switching circuit 1 of FIG. 1A, the relationships between the first driving circuit 3 and associated components in the power switching circuit 1c of FIG. 6A are distinguished. As shown in FIG. 6A, the first connection branch 31 of the first driving circuit 3 of the power switching circuit 1c in this embodiment includes a second resistor R2, a fifth resistor R5 and a third switch element Q3. The first terminal of the fifth resistor R5 is connected with the negative driving signal terminal 22. The third switch element Q3 includes a third driving terminal 71, a first conduction terminal 72 and a second conduction terminal 73. The third driving terminal 71 of the third switch element Q3 is connected with the second resistor R2. The first conduction terminal 72 of the third switch element Q3 is connected with the second terminal of the fifth resistor R5. The second conduction terminal 73 of the third switch element Q3 is connected with the first driving terminal 51 of the first switch element Q1.

In one embodiment, the third switch element Q3 is a PNP transistor switch, a P-type MOSFET transistor or other types of switch element. The second resistor R2 is connected between the positive driving signal terminal 21 and the third driving terminal 71 of the third switch element Q3.

In some other embodiments, the first connection branch 3 further includes a second diode D2. The anode of the second diode D2 is connected with the third driving terminal 71 of the third switch element Q3. The cathode of the second diode D2 is connected with the second conduction terminal 73 of the third switch element Q3. Due to the arrangement of the second diode D2, the threshold voltage of the third switch element Q3 does not exceed its safety limitation.

In an embodiment, the resistance value of the first resistor R1 is smaller than the resistance value of the third resistor R3, the resistance value of the fifth resistor R5 is smaller than the resistance value of the fourth resistor R4, and the resistance value of the fifth resistor R5 is smaller than the resistance value of the first resistor R1. In another embodiment, the resistance value of the first resistor R1 is smaller than the resistance value of second resistor R2, and the resistance value of the fourth resistor R4 is smaller than the resistance of the third resistor R3. Since the resistance value of the first resistor R1 is smaller than the resistance value of the second resistor R2, the driving current of the third switch element Q3 in the power switching circuit 1c does not exceed the safety limitation. Moreover, the reason for setting resistance value of the fourth resistor R4 and the third resistor R3 is similar to the reason for setting resistance value of the first resistor R1 and the second resistor R2 in the first embodiment.

Figure 6B:
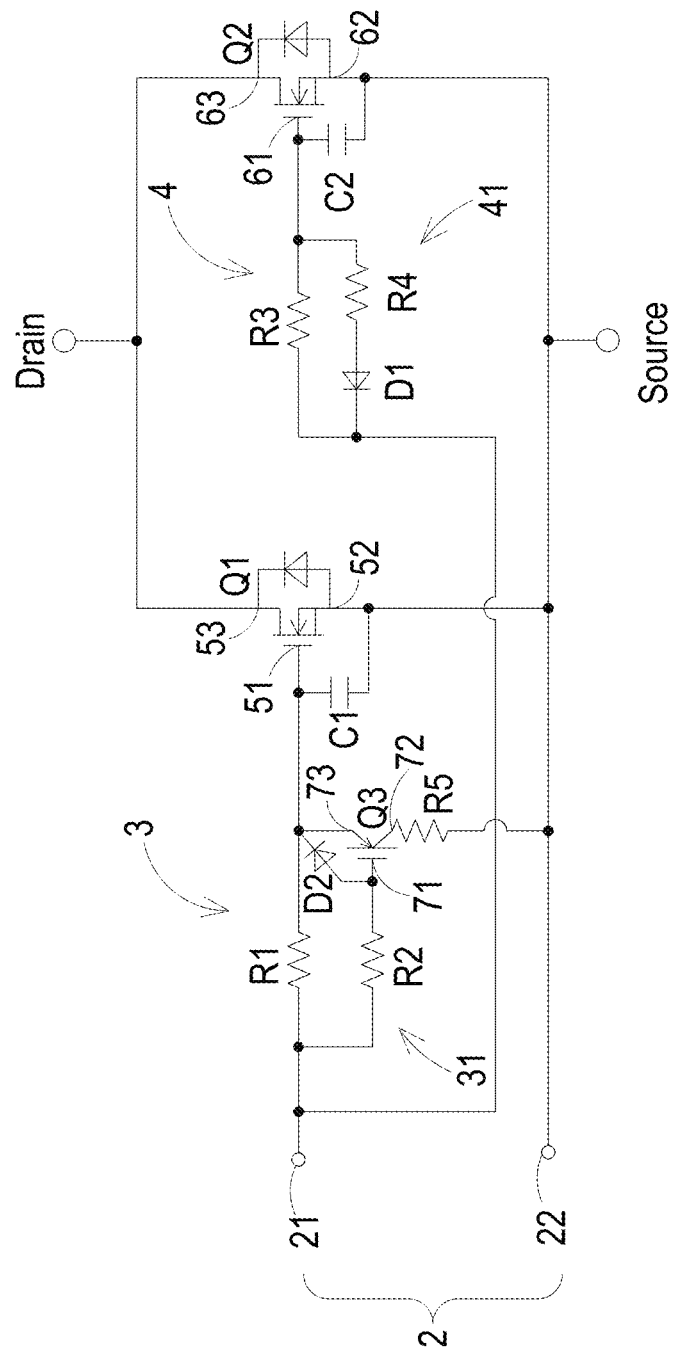
FIG. 6B is a schematic circuit diagram illustrating the circuitry topology of a power switching circuit according to a seventh embodiment of the present disclosure.

The power switching circuit 1c of FIG. 6B is a variant example of the power switching circuit 1c of FIG. 6A. As shown in FIG. 6B, the positions of the fourth resistor R4 and the first diode D1 in the second connection branch 41 are exchanged when compared with the circuitry topology of FIG. 6A. That is, the cathode of the first diode D1 is connected with the positive driving signal terminal 21, and the fourth resistor R4 is connected between the anode of the first diode D1 and the second driving terminal 61 of the second switch element Q2.

The operations of the power switching circuit 1c in the charging mode will be described with reference to FIG. 7A. When the input current received by the driving signal part 2 is a positive current, or the potential of the positive driving signal terminal 21 is higher than the potential of the negative driving signal terminal 22 (i.e., the input voltage received by the driving signal part 2 is a positive voltage). Meanwhile, the first total capacitor C1 and the second total capacitor C2 are charged by the input current. Under this circumstance, the input current flows through the power switching circuit 1c along two current paths.

In the first current path, the input current flows from the positive driving signal terminal 21 to the negative driving signal terminal 22 through the parallel-connected structure of the first resistor R1 and the first connection branch 31 (comprising the second resistor R2 and the second diode D2) and the first total capacitor C1. Consequently, the first total capacitor C1 is charged by the input current. If the voltage of the first total capacitor C1 is higher than a threshold voltage between the first driving terminal 51 and the first conduction terminal 52 of the first switch element Q1, the first switch element Q1 is turned on. When the first switch element Q1 is turned on, the inductor current can flow through the second conduction terminal 53 and the first conduction terminal 52 of the first switch element Q1.

In the second current path, the input current flows from the positive driving signal terminal 21 to the negative driving signal terminal 22 through the third resistor R3 and the second total capacitor C2. Consequently, the second total capacitor C2 is charged by the input current. If the voltage of the second total capacitor C2 is higher than the threshold voltage between the second driving terminal 61 and the first conduction terminal 62 of the second switch element Q2, the second switch element Q2 is turned on. When the second switch element Q2 is turned on, the inductor current can flow through the second conduction terminal 63 and the first conduction terminal 62 of the second switch element Q2.

The resistance value of the parallel-connected structure of the first resistor R1 and the second resistor R2 in the first current path is smaller than the resistance value of the third resistor R3 in the second current path because the resistance value of the first resistor R1 is smaller than the resistance value of the third resistor R3. Consequently, the charging time constant in the first current path (i.e., the resistance value of the parallel-connected structure of the first resistor R1 and the second resistor R2 multiplied by the capacitance value of the first total capacitor C1) is smaller than the charging time constant in the second current path (i.e., the resistance value of the third resistor R3 multiplied by the capacitance value of the second total capacitor C2). It is assumed that the capacitance value of the first total capacitor C1 and the capacitance value of the second total capacitor C2 are equal and the voltage drop across the second diode D2 are ignored. In other words, the time constant of the resistor and the capacitor corresponding to turning on the first switch element Q1 is smaller than the time constant of the resistor and the capacitor corresponding to turning on the second switch element Q2.

Consequently, in the same switching cycle, the turn-on time of the first switch element Q1 in the first current path is earlier than the turn-on time of the second switch element Q2 in the second current path. Due to the fact that when the second switch element Q2 is turned on, the first switch element Q1 has been completely turned on, the second switch element Q2 is turned on in the zero voltage switching manner and almost no turn-on loss is generated.

In some other embodiments, the first connection branch 31 does not include the second diode. In comparison with the first current path in FIG. 7A, the first current path is distinguished. In this embodiment, the input current flows from the positive driving signal terminal 21 to the negative driving signal terminal 22 through the first resistor R1 and the first total capacitor C1. Meanwhile, the charging time constant in the first current path (i.e., R1×C1) is smaller than the charging time constant in the second current path (i.e., R3×C2).

The operations of the power switching circuit 1c in the discharging mode will be described with reference to FIG. 7B. When the input current received by the driving signal part 2 is a negative current, or the potential of the positive driving signal terminal 21 is lower than or equal to the potential of the negative driving signal terminal 22 (i.e., the input voltage received by the driving signal part 2 is a negative voltage or zero). Meanwhile, the first total capacitor C1 and the second total capacitor C2 are discharged. Under this circumstance, the input current flows through the power switching circuit 1c along two current paths.

In a first portion of the first current path, the input current flows from the negative driving signal terminal 22 to the positive driving signal terminal 21 through the first total capacitor C1 and the parallel-connected structure of the first resistor R1 and the first connection branch 31 (comprising the third switch element Q3 and the second resistor R2). In a second portion of the first current path, the input current flows from the negative driving signal terminal 22 and flows through the first total capacitor C1, the third switch element Q3 and the fifth resistor R5. Consequently, the first total capacitor C1 is discharged. If the voltage of the first total capacitor C1 is lower than the threshold voltage between the first driving terminal 51 and the first conduction terminal 52 of the first switch element Q1, the first switch element Q1 is turned off. In this embodiment, the second portion of the first current path (i.e., the path flowing through the fifth resistor R5) is the main path that the first total capacitor C1 is discharged. Consequently, the resistance value of the fifth resistor R5 is smaller than the resistance value of the first resistor R1. When the first switch element Q1 is turned off, the inductor current cannot flow through the second conduction terminal 53 and the first conduction terminal 52 of the first switch element Q1.

In the second current path, the input current flows from the negative driving signal terminal 22 to the positive driving signal terminal 21 through the second total capacitor C2 and the parallel-connected structure of the third resistor R3 and the second connection branch 41. Consequently, the second total capacitor C2 is discharged. If the voltage of the second total capacitor C2 is lower than the threshold voltage between the second driving terminal 61 and the first conduction terminal 62 of the second switch element Q2, the second switch element Q2 is turned off. When the second switch element Q2 is turned off, the inductor current cannot flow through the second conduction terminal 63 and the first conduction terminal 62 of the second switch element Q2.

The resistance value of the parallel-connected structure of the first resistor R1, the second resistor R2 and the fifth resistor R5 in the first current path is smaller than the resistance value of the parallel-connected structure of the third resistor R3 and the fourth resistor R4 in the second current path because the resistance value of the first resistor R1 is smaller than the resistance value of the third resistor R3 and the resistance value of the fifth resistor R5 is smaller than the resistance value of the fourth resistor R4. Consequently, the discharging time constant in the first current path (i.e., the resistance value of the parallel-connected structure of the first resistor R1, the second resistor R2 and the fifth resistor R5 multiplied by the capacitance value of the first total capacitor C1) is smaller than the discharging time constant in the second current path (i.e., the resistance value of the parallel-connected structure of the third resistor R3 and the fourth resistor R4 multiplied by the capacitance value of the second total capacitor C2).

It is assumed that the capacitance value of the first total capacitor C1 and the capacitance value of the second total capacitor C2 are equal. In addition, the voltage drop across the first diode D1 and the voltage drop across the third switch element Q3 are ignored. In other words, the time constant of the resistor and the capacitor corresponding to turning off the first switch element Q1 is smaller than the time constant of the resistor and the capacitor corresponding to turning off the second switch element Q2. Consequently, in the same switching cycle, the turn-off time of the first switch element Q1 in the first current path is earlier than the turn-off time of the second switch element Q2 in the second current path. Due to the fact that the first switch element Q1 turns off earlier than the second switch element Q2, the first switch element Q1 is turned off in the zero voltage switching manner and almost no turn-off loss is generated.

In some embodiments, the relationships between the third resistor R3 and the second connection branch 41 of the second driving circuit 4 and associated components may be varied according to practical requirements.

Figure 8A:
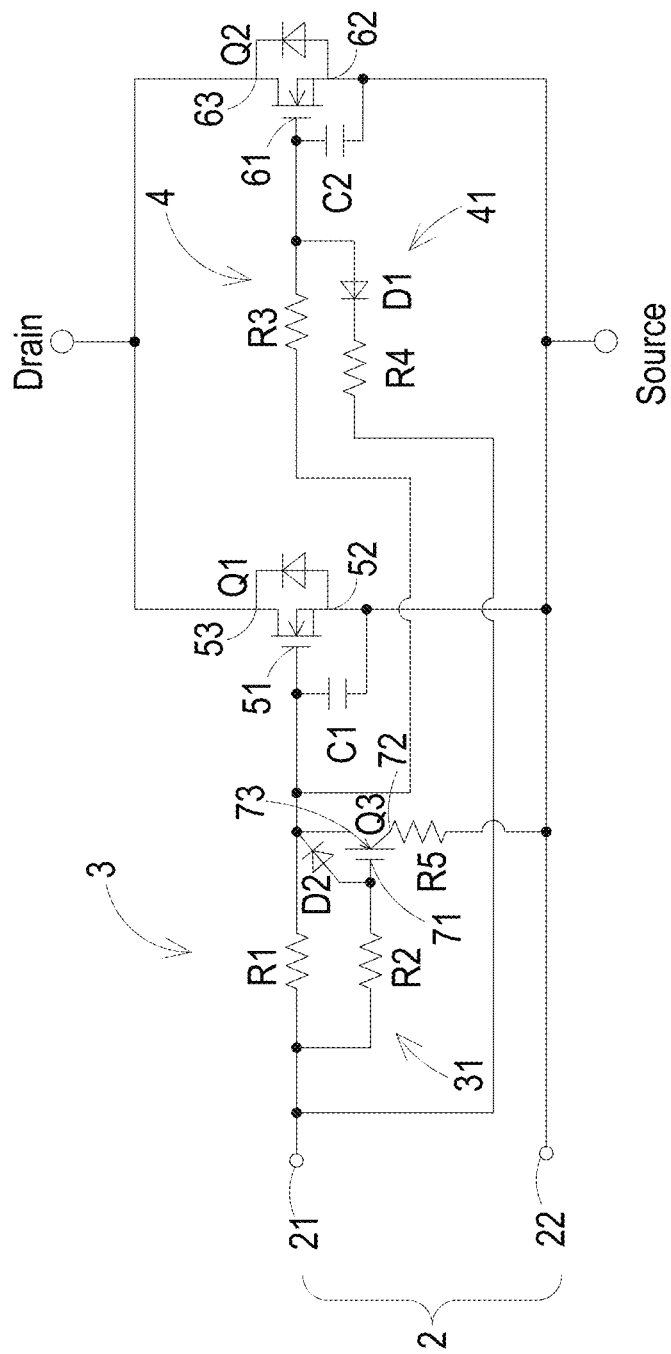
FIG. 8A is a schematic circuit diagram illustrating the circuitry topology of a power switching circuit according to an eighth embodiment of the present disclosure.

FIG. 8A is a schematic circuit diagram illustrating the circuitry topology of a power switching circuit according to an eighth embodiment of the present disclosure. The circuitry topology of the power switching circuit 1d, the current flowing directions of the power switching circuit 1d in the charging/discharging modes, the operating principles of the power switching circuit 1d and the voltage/current waveforms are similar to those of the power switching circuit 1c of the sixth embodiment (e.g., as shown in FIGS. 6A to 7B). Component parts and elements corresponding to those of the sixth embodiment are designated by identical numeral references, and detailed descriptions thereof are omitted.

In comparison with the power switching circuit 1c of FIG. 6A, the relationships between the second driving circuit 4 and associated components in the power switching circuit 1d of FIG. 8A are distinguished. As shown in FIG. 8A, the resistor R3 in the power switching circuit 1d is connected between the first driving terminal 51 of the first switch element Q1 and the second driving terminal 61 of the second switch element Q2. Consequently, the positive current received by the driving signal part 2 flows to the second switch element Q2 through the first resistor R1 and the second resistor R2 of the first driving circuit 3. In some other embodiments, the first connection branch 31 is not equipped with the second diode D2. Under this circumstance, the positive current received by the driving signal part 2 flows through the second switch element Q2 after flowing through the first resistor R1 of the first driving circuit 3. Please refer to FIG. 8A again. When the second total capacitor C2 is charged, the input current flows through the power switching circuit 1d through two current paths. In the second current path, the input current flows from the positive driving signal terminal 21 to the negative driving signal terminal 22 through the parallel-connected structure of the first resistor R1 and the second resistor R2, the third resistor R3 and the second total capacitor C2.

In this embodiment, the negative current received by the driving signal part 2 flows to the positive driving signal terminal 21 through the second switch element Q2 and the first driving circuit 3. Similarly, when the second total capacitor C2 is discharged, the input current flows through the power switching circuit 1d through two current paths. In the second current path, the input current flows from the negative driving signal terminal 22 to the positive driving terminal 21 through the second total capacitor C2 and the parallel-connected structure of a series-connected structure (i.e., the third resistor R3 and the first connection branch 31) and the second connected branch 42. Consequently, the turn-on time of the first switch element Q1 is earlier than the turn-on time of the second switch element Q2, and the turn-off time of the first switch element Q1 is earlier than the turn-off time of the second switch element Q2.

In case that the input current received by the driving signal part 2 is a positive current or the input voltage received by the driving signal part 2 is a positive voltage, the first current path in the power switching circuit 1d of this embodiment is identical to the first current path in the power switching circuit 1c of the sixth embodiment. The operating principles of the power switching circuit 1d will be described as follows. For illustration, the first connection branch 31 with the second diode D2 will be taken as an example. In case that the first connection branch 31 is not equipped with the second diode D2, the operating principles are similar. The resistance value of the parallel-connected structure of the first resistor R1 and the second resistor R2 in the first current path is smaller than the resistance value of the series-connected structure of the resistor R3 and the parallel-connected structure of the first resistor R1and the second resistor R2 in the second current path. Consequently, the charging time constant in the first current path (i.e., the resistance value of the parallel-connected structure of the first resistor R1 and the second resistor R2 multiplied by the capacitance value of the first total capacitor C1) is smaller than the charging time constant in the second current path (i.e., the resistance value of the parallel-connected structure of the first resistor R1 and the second resistor R2 and the resistance value of the third resistor R3 are added together and multiplied by the capacitance value of the second total capacitor C2). The arrangement of the first total capacitor C1 and the second total capacitor C2 of this embodiment and the arrangement of those in the sixth embodiment are identical. Consequently, in the same switching cycle, the turn-on time of the first switch element Q1 in the first current path is earlier than the turn-on time of the second switch element Q2 in the second current path.

In case that the input current received by the driving signal part 2 is a negative current or the input voltage received by the driving signal part 2 is a zero voltage or a negative voltage, the first current path in the power switching circuit 1d of this embodiment is identical to the first current path in the power switching circuit 1 of the first embodiment. The resistance value of the parallel-connected structure of the first resistor R1, the second resistor R2 and the fifth resistor R5 in the first current path is smaller than the resistance value of the parallel-connected structure of the fourth resistor R4 and the series-connected structure of the third resistor R3 and the first connection path 31 in the second current path. Consequently, the discharging time constant in the first current path (i.e., the resistance value of the parallel-connected structure of the first resistor R1, the second resistor R2 and the fifth resistor R5 multiplied by the capacitance value of the first total capacitor C1) is smaller than the discharging time constant in the second current path (i.e., the resistance value of the parallel-connected structure of the fourth resistor R4 and the series-connected structure of the third resistor R3 and the first connection branch 31 multiplied by the capacitance value of the second total capacitor C2).

In a variable example, the resistance value of the fifth resistor R5 is 0Ω. The arrangement of the first capacitor C1 and the second capacitor C2 are similar to those in the first embodiment. Moreover, the voltage drop across the first diode D1 and the voltage drop across the third switch element Q3 are ignored. Consequently, in the same switching cycle, the turn-off time of the first switch element Q1 in the first current path is earlier than the turn-off time of the second switch element Q2 in the second current path.

Figure 8B:
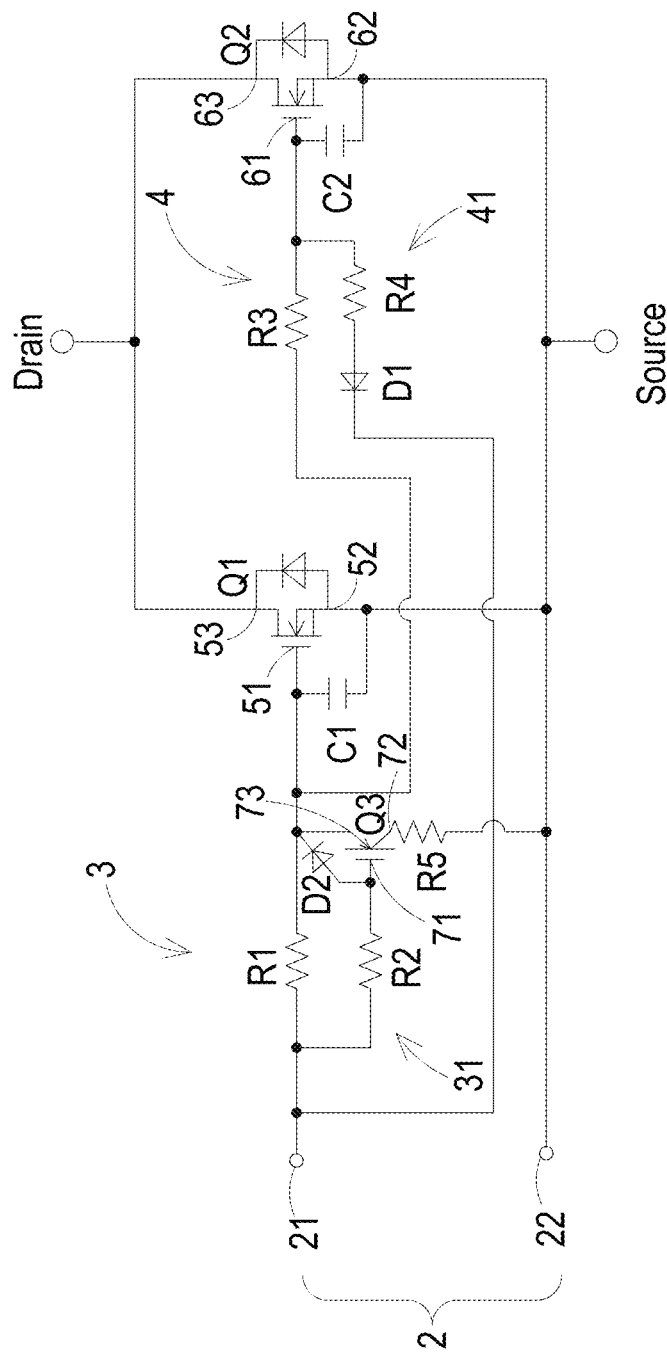
FIG. 8B is a schematic circuit diagram illustrating the circuitry topology of a power switching circuit according to a ninth embodiment of the present disclosure.

FIG. 8B is a schematic circuit diagram illustrating the circuitry topology of a power switching circuit according to a ninth embodiment of the present disclosure. The power switching circuit 1d of FIG. 8B is a variant example of the power switching circuit 1d of FIG. 8A. As shown in FIG. 8B, the positions of the fourth resistor R4 and the first diode D1 in the second connection branch 41 are exchanged when compared with the circuitry topology of FIG. 8A. That is, the cathode of the first diode D1 is connected with the positive driving signal terminal 21, and the fourth resistor R4 is connected between the anode of the first diode D1 and the second driving terminal 61 of the second switch element Q2.

Figure 9A:
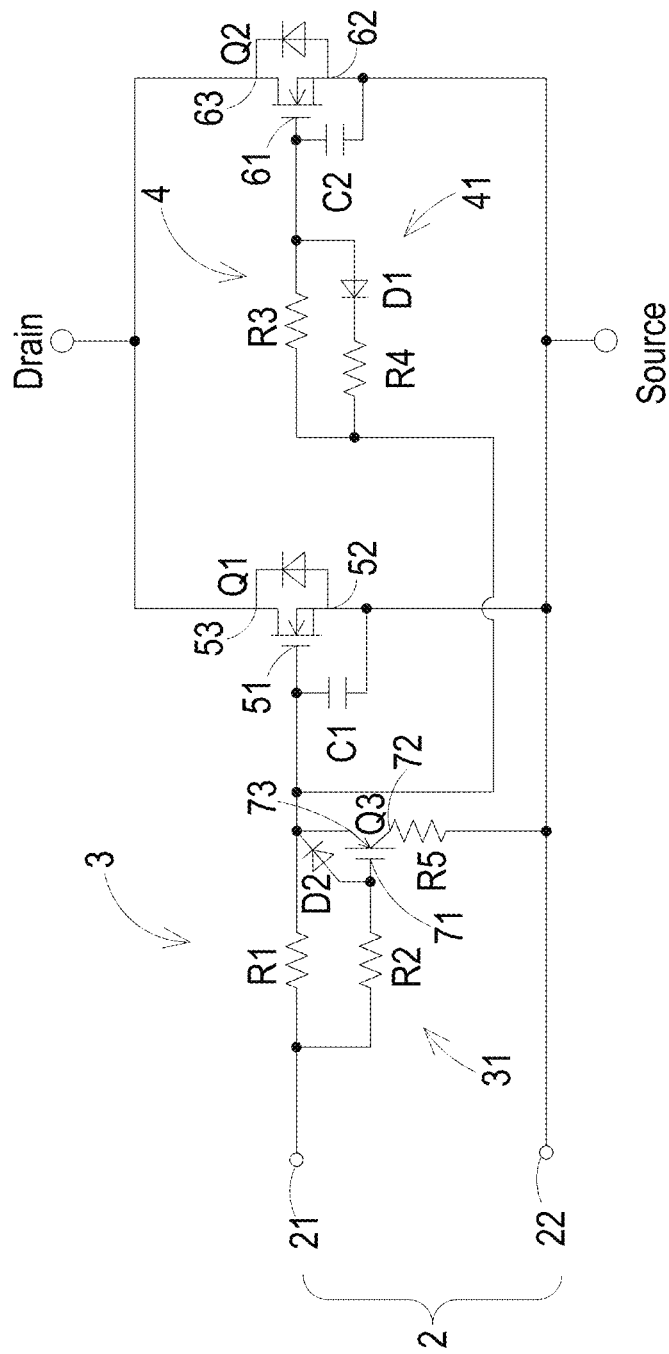
FIG. 9A is a schematic circuit diagram illustrating the circuitry topology of a power switching circuit according to a tenth embodiment of the present disclosure.

FIG. 9A is a schematic circuit diagram illustrating the circuitry topology of a power switching circuit according to a tenth embodiment of the present disclosure. The circuitry topology of the power switching circuit 1e, the current flowing directions of the power switching circuit 1e in the charging/discharging modes, the operating principles of the power switching circuit 1e and the voltage/current waveforms are similar to those of the power switching circuit 1c of the sixth embodiment (e.g., as shown in FIGS. 6A to 7B). Component parts and elements corresponding to those of the sixth embodiment are designated by identical numeral references, and detailed descriptions thereof are omitted.

In comparison with the power switching circuit 1c of FIG. 6A, the relationships between the second driving circuit 4 and associated components in the power switching circuit 1e of FIG. 9A are distinguished. As shown in FIG. 9A, the resistor R3 in the power switching circuit 1e is connected between the first driving terminal 51 of the first switch element Q1 and the second driving terminal 61 of the second switch element Q2. The first diode D1 of the second connection branch 41 and the fourth resistor R4 are connected between the first driving terminal 51 of the first switch element Q1 and the second driving terminal 61 of the second switch element Q2. The fourth resistor R4 is connected between the first driving terminal 51 of the first switch element Q1 and the cathode of the first diode D1. The anode of the first diode D1 is connected with the second driving terminal 61 of the second switch element Q2.

Figure 9B:
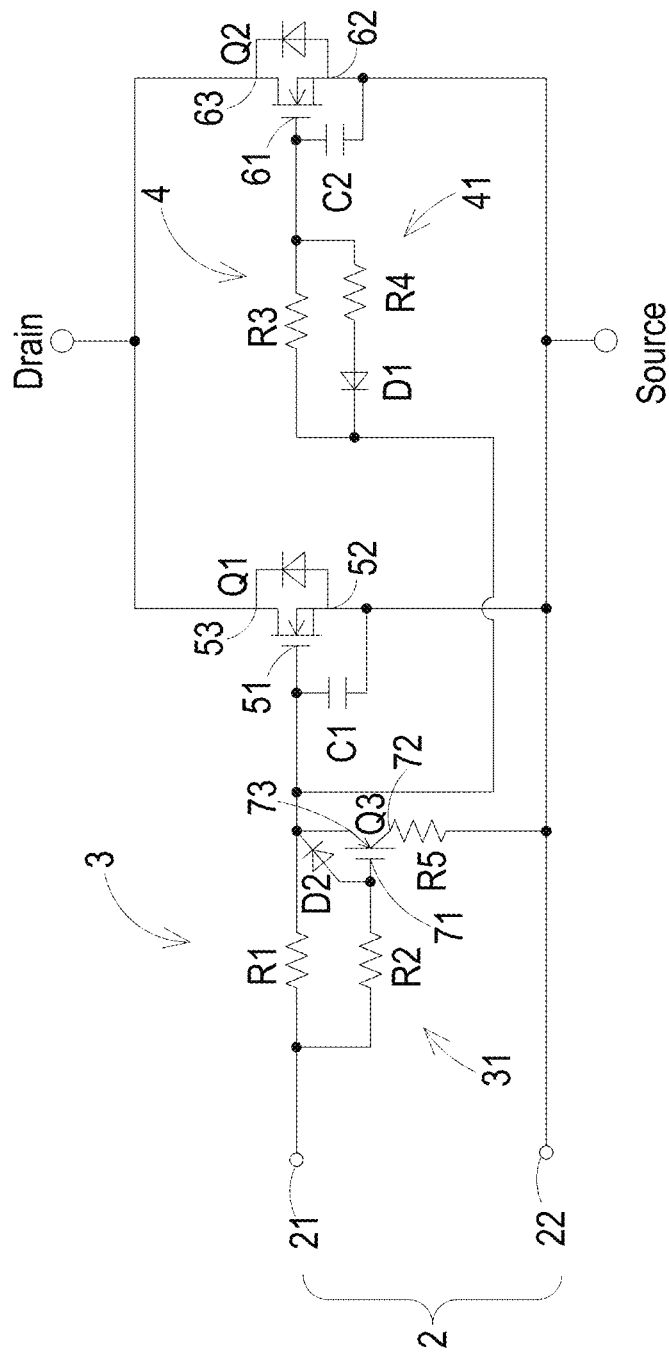
FIG. 9B is a schematic circuit diagram illustrating the circuitry topology of a power switching circuit according to an eleventh embodiment of the present disclosure.

FIG. 9B is a schematic circuit diagram illustrating the circuitry topology of a power switching circuit according to an eleventh embodiment of the present disclosure. The power switching circuit 1e of FIG. 9B is a variant example of the power switching circuit 1e of FIG. 9A. As shown in FIG. 9B, the positions of the fourth resistor R4 and the first diode D1 in the second connection branch 41 are exchanged when compared with the circuitry topology of FIG. 9A. The cathode of the first diode D1 is connected between the first driving terminal 51 of the first switch element Q1. The fourth resistor R4 is connected with the anode of the first diode D1 and the second driving terminal 61 of the second switch element Q2.

Consequently, the positive current received by the driving signal part 2 flows to the second switch element Q2 through the parallel-connected structure of the first resistor R1 and the second resistor R2 of the first driving circuit 3. In some other embodiments, the first connection branch 31 is not equipped with the second diode D2. Under this circumstance, the positive current received by the driving signal part 2 needs to flow through the first resistor R1 of the first driving circuit 3 before flowing through the second switch element Q2. Please refer to FIG. 9A again. When the second total capacitor C2 is charged, the input current flows through the power switching circuit 1e through two current paths. In the second current path, the input current flows from the positive driving signal terminal 21 to the negative driving signal terminal 22 through the parallel-connected structure of the first resistor R1 and the second resistor R2, the third resistor R3 and the second total capacitor C2.

In this embodiment, the negative current received by the driving signal part 2 flows to the positive signal terminal 21 through the second switch element Q2 and the first driving circuit 3. Similarly, when the second total capacitor C2 is discharged, the input current flows through the power switching circuit 1e through two current paths. In the second current path, the input current flows from the negative driving signal terminal 22 to the positive driving signal terminal 21 through the second total capacitor C2, the parallel-connected structure of the second connection branch 41 and the third resistor R3 and the parallel-connected structure of the first connection branch 31 and the first resistor R1. Consequently, the turn-on time of the first switch element Q1 is earlier than the turn-on time of the second switch element Q2, and the turn-off time of the first switch element Q1 is earlier than the turn-off time of the second switch element Q2.

In case that the input current received by the driving signal part 2 is a positive current or the input voltage received by the driving signal part 2 is a positive voltage, the first current path in the power switching circuit 1e of this embodiment is identical to the first current path in the power switching circuit 1c of the sixth embodiment. The operating principles of the power switching circuit 1e will be described as follows. For illustration, the first connection branch 31 with the second diode D2 will be taken as an example. In case that the first connection branch 31 is not equipped with the second diode D2, the operating principles are similar. The resistance value of the parallel-connected structure of the first resistor R1 and the second resistor R2 in the first current path is smaller than the resistance value of the series-connected structure of the resistor R3 and the parallel-connected structure of the first resistor R1 and the second resistor R2 in the second current path. Consequently, the charging time constant in the first current path (i.e., the resistance value of the parallel-connected structure of the first resistor R1 and the second resistor R2 multiplied by the capacitance value of the first total capacitor C1) is smaller than the charging time constant in the second current path (i.e., the resistance value of the series-connected structure of the resistor R3 and the parallel-connected structure of the first resistor R1 and the second resistor R2 multiplied by the capacitance value of the second total capacitor C2). The arrangement of the first total capacitor C1 and the second total capacitor C2 of this embodiment and the arrangement of those in the sixth embodiment are identical. Consequently, in the same switching cycle, the turn-on time of the first switch element Q1 in the first current path is earlier than the turn-on time of the second switch element Q2 in the second current path.

In case that the input current received by the driving signal part 2 is a negative current or the input voltage received by the driving signal part 2 is a zero voltage or a negative voltage, the first current path in the power switching circuit 1e of this embodiment is identical to the first current path in the power switching circuit 1c of the sixth embodiment. The resistance value of the first driving circuit 3 in the first current path is smaller than the resistance value of the series-connected structure of the first driving circuit 3 and the second driving circuit 4. Consequently, the discharging time constant in the first current path is smaller than the discharging time constant in the second current path. Moreover, the arrangement of the first capacitor C1 and the second capacitor C2 and the arrangement of those of the first embodiment, and the voltage drop across the first diode D1 and the voltage drop across the third switch element Q3 are ignored. Consequently, in the same switching cycle, the turn-off time of the first switch element Q1 in the first current path is earlier than the turn-off time of the second switch element Q2 in the second switch element Q2.

FIG. 10 is a flowchart of a control method for a power switching circuit according to an embodiment. Please refer to FIG. 10 and also refer to FIGS. 1A, 2A and 2B.

In a step S1, a first driving circuit 3 is provided. The first driving circuit 3 includes a first resistor R1 and a first connection branch 31. The first resistor R1 and the first connection branch 31 are connected between the positive driving signal terminal 21 of the driving signal part 2 and the first driving terminal 51 of the first switch element Q1, respectively. In addition, the first connection branch 31 includes a second resistor R2.

In a step S2, a second driving circuit 4 is provided. The second driving circuit 4 includes a third resistor R3 and a second connection branch 41. The third resistor R3 and the second connection branch 41 are connected between the positive driving signal terminal 21 of the driving signal part 2 and the second driving terminal 61 of the second switch element Q2, respectively. The second connection branch 41 includes a fourth resistor R4 and a first diode D1.

In a step S3, in a same switching cycle, when the input current received by the driving signal part 2 is a positive current or the input voltage received by the driving signal part 2 is a positive voltage, the turn-on time of the first switch element Q1 is earlier than the turn-on time of the second switch element Q2 through the first driving circuit 3 and the second driving circuit 4. When the input current received by the driving signal part 2 is a negative current or the input voltage received by the driving signal part 2 is a negative voltage or zero, the turn-off time of the first switch element Q1 is earlier than the turn-off time of the second switch element Q2 through the first driving circuit 3 and the second driving circuit 4.

From the above descriptions, the power switching circuit includes the first driving circuit and the second driving circuit. The first driving circuit includes the first resistor and the first connection branch. The first resistor and the first connection branch are connected between the positive driving signal terminal of the driving signal part and the first driving terminal of the first switch element, respectively. The second driving circuit includes the third resistor and the second connection branch. The third resistor and the second connection branch are connected between the positive driving signal terminal of the driving signal part and the first driving terminal of the second switch element, respectively. Due to the arrangement of the first driving circuit and the second driving circuit, in the same switching cycle, the turn-on time of the first switch element is earlier than the turn-on time of the second switch element, and the turn-off time of the first switch element is earlier than the turn-off time of the second switch element. That is, in the transient state when the switch elements of the power switching circuit are turned on or turned off, the inconsistent transient current-sharing phenomenon is avoided. Consequently, the switching loss and turn-off loss are respectively distributed to the two switch elements. That is, the first switch element bears all (or most) turn-on loss but does not bear (or bears little) turn-off loss, and the second switch element bears all (or most) turn-off loss but does not bear (or bears little) turn-on loss. The turn-on duration of the first switch element and the turn-on duration of the second switch element are basically identical. Consequently, the loss and temperature of the two switching elements can be reduced. In this way, the output stability and lifespan of the overall power switching circuit are enhanced, the power density is increased, and the installation cost is reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power switching circuit, comprising:
   a driving signal part receiving an input current or an input voltage, and comprising a positive driving signal terminal and a negative driving signal terminal;
   a first switch element;
   a second switch element connected with the first switch element in parallel;
   a first driving circuit comprising a first resistor and a first connection branch, wherein the first resistor and the first connection branch are connected between the positive driving signal terminal and a first driving terminal of the first switch element, respectively, and the first connection branch comprises a second resistor; and
   a second driving circuit comprising a third resistor and a second connection branch, wherein the third resistor and the second connection branch are connected between the positive driving signal terminal and a second driving terminal of the second switch element, respectively, and the second connection branch comprises a fourth resistor and a first diode,
   wherein in a same switching cycle, when the input current is a positive current or the input voltage is a positive voltage, the turn-on time of the first switch element is earlier than the turn-on time of the second switch element through the first driving circuit and the second driving circuit, when the input current is a negative current or the input voltage is a negative voltage or zero, the turn-off time of the first switch element is earlier than the turn-off time of the second switch element through the first driving circuit and the second driving circuit.

2. The power switching circuit according to claim 1, wherein the first connection branch further comprises a second diode, and the second resistor and the second diode are serially connected between the positive driving signal terminal and the first driving terminal of the first switch element, wherein the second resistor is connected between the positive driving signal terminal and a cathode of the second diode and an anode of the second diode is connected with the first driving terminal of the first switch element, or wherein the cathode of the second diode is connected with the positive driving signal terminal and the second resistor is connected between the anode of the second diode and the first driving terminal of the first switch element.

3. The power switching circuit according to claim 2, wherein the fourth resistor and the first diode are serially connected between the positive driving signal terminal and the second driving terminal of the second switch element, wherein the fourth resistor is connected between the positive driving signal terminal and a cathode of the first diode and an anode of the first diode is connected with the second driving terminal of the second switch element, or wherein the cathode of the first diode is connected with the positive driving signal terminal and the fourth resistor is connected between the anode of the first diode and the second driving terminal of the second switch element.

4. The power switching circuit according to claim 3, wherein a resistance value of the third resistor is greater than a resistance value of the first resistor, and a resistance value of the fourth resistor is greater than or equal to a resistance value of the second resistor.

5. The power switching circuit according to claim 3, wherein the third resistor is connected between the first driving terminal of the first switch element and the second driving terminal of the second switch element.

6. The power switching circuit according to claim 5, wherein a resistance value of the second resistor is 0Ω.

7. The power switching circuit according to claim 2, wherein the third resistor and the second connection branch are connected between the first driving terminal of the first switch element and the second driving terminal of the second switch element, wherein the fourth resistor is connected between the first driving terminal of the first switch element and a cathode of the first diode and an anode of the first diode is connected with the second driving terminal of the second switch element, or wherein the cathode of the first diode is connected with the first driving terminal of the first switch element and the fourth resistor is connected between the anode of the first diode and the second driving terminal of the second switch element.

8. The power switching circuit according to claim 1, wherein a resistance value of the second resistor is smaller than a resistance value of the first resistor, and/or a resistance value of the fourth resistor is smaller than a resistance value of the third resistor.

9. The power switching circuit according to claim 1, wherein the first connection branch further comprises a fifth resistor and a third switch element, wherein a first terminal of the fifth resistor is connected with the negative driving signal terminal, a first conduction terminal of the third switch element is connected with a second terminal of the fifth resistor, a second conduction terminal of the third switch element is connected with the first driving terminal of the first switch element, and the second resistor is connected between the positive driving signal terminal and a third driving terminal of the third switch element.

10. The power switching circuit according to claim 9, wherein the first connection branch further comprises a second diode, wherein an anode of the second diode is connected with the third driving terminal of the third switch element, and a cathode of the second diode is connected with the second conduction terminal of the third switch element.

11. The power switching circuit according to claim 9, wherein the fourth resistor and the first diode are serially connected between the positive driving signal terminal and the second driving terminal of the second switch element, wherein the fourth resistor is connected between the positive driving signal terminal and a cathode of the first diode and an anode of the first diode is connected with the second driving terminal of the second switch element, or wherein the cathode of the first diode is connected with the positive driving signal terminal and the fourth resistor is connected between the anode of the first diode and the second driving terminal of the second switch element.

12. The power switching circuit according to claim 11, wherein a resistance value of the third resistor is greater than a resistance value of the first resistor, a resistance value of the fifth resistor is smaller than a resistance value of the fourth resistor, and the resistance value of the fifth resistor is smaller than the resistance value of the first resistor.

13. The power switching circuit according to claim 11, wherein the third resistor is connected between the first driving terminal of the first switch element and the second driving terminal of the second switch element.

14. The power switching circuit according to claim 13, wherein a resistance value of the fifth resistor is 0Ω.

15. The power switching circuit according to claim 9, wherein the third resistor and the second connection branch are connected between the first driving terminal of the first switch element and the second driving terminal of the second switch element, respectively, wherein the fourth resistor is connected between the first driving terminal of the first switch element and a cathode of the first diode and an anode of the first diode is connected with the second driving terminal of the second switch element, or wherein the cathode of the first diode is connected with the first driving terminal of the first switch element and the fourth resistor is connected between the anode of the first diode and the second driving terminal of the second switch element.

16. The power switching circuit according to claim 9, wherein a resistance value of the first resistor is smaller than a resistance value of the second resistor, and/or a resistance value of the fourth resistor is smaller than a resistance value of the third resistor.

17. The power switching circuit according to claim 1, wherein the power switching circuit further comprises a first total capacitor and/or a second total capacitor, wherein the first total capacitor comprises a first parasitic capacitor of the first switch element, and the first parasitic capacitor is connected between the first driving terminal of the first switch element and a first conduction terminal of the first switch element, wherein the second total capacitor comprises a second parasitic capacitor of the second switch element, and the second parasitic capacitor is connected between the second driving terminal of the second switch element and a first conduction terminal of the second switch element.

18. The power switching circuit according to claim 17, wherein the first total capacitor further comprises a first additional capacitor, and/or the second total capacitor further comprises a second additional capacitor, wherein the first additional capacitor is connected between the first driving terminal of the first switch element and the first conduction terminal of the first switch element, and the second additional capacitor is connected between the second driving terminal of the second switch element and the first conduction terminal of the second switch element.

19. The power switching circuit according to claim 17, wherein when the input current is the positive current or the input voltage is the positive voltage, the first total capacitor and the second total capacitor are charged by the input current, wherein the first switch element is turned on when a voltage across the first total capacitor is higher than a threshold voltage of the first switch element, and the second switch element is turned on when a voltage across the second total capacitor is higher than a threshold voltage of the second switch element, wherein when the input current is the negative current or the input voltage is the negative voltage or zero, the first total capacitor and the second total capacitor are discharged, wherein the first switch element is turned off when the voltage across the first total capacitor is lower than the threshold voltage of the first switch element, and the second switch element is turned off when the voltage across the second total capacitor is lower than the threshold voltage of the second switch element.

20. The power switching circuit according to claim 19, wherein when the first total capacitor and the second total capacitor are charged, the first total capacitor and the second total capacitor are charged at a same time point, and/or, wherein when the first total capacitor and the second total capacitor are discharged, the first total capacitor and the second total capacitor are discharged at a same time point.

21. The power switching circuit according to claim 17, wherein a capacitance value of the first total capacitor and a capacitance value of the second total capacitor are equal.

22. The power switching circuit according to claim 1, wherein a first time constant of a resistor and a capacitor corresponding to turning on the first switch element is smaller than a second time constant of a resistor and a capacitor corresponding to turning on the second switch element, so that the turn-on time of the first switch element is earlier than the turn-on time of the second switch element in the same switching cycle, wherein a third time constant of a resistor and a capacitor corresponding to turning off the first switch element is smaller than a fourth time constant of a resistor and a capacitor corresponding to turning off the second switch element, so that the turn-off time of the first switch element is earlier than the turn-off time of the second switch element in the same switching cycle.

23. A control method for a power switching circuit, the power switching circuit comprising a driving signal part, a first switch element and a second switch element, the driving signal part comprising a positive driving signal terminal and a negative driving signal terminal, the driving signal part receiving an input current or an input voltage, the first switch element and the second switch element being connected in parallel, the control method comprising:

providing a first driving circuit, wherein the first driving circuit comprises a first resistor and a first connection branch, wherein the first resistor and the first connection branch are connected between the positive driving signal terminal and a first driving terminal of the first switch element, respectively, and the first connection branch comprises a second resistor;

providing a second driving circuit, wherein the second driving circuit comprises a third resistor and a second connection branch, wherein the third resistor and the second connection branch are connected between the positive driving signal terminal and a second driving terminal of the second switch element, respectively, and the second connection branch comprises a fourth resistor and a first diode; and wherein in a same switching cycle, when the input current is a positive current or the input voltage is a positive voltage, the turn-on time of the first switch element is earlier than the turn-on time of the second switch element through the first driving circuit and the second driving circuit, when the input current is a negative current or the input voltage is a negative voltage or zero, the turn-off time of the first switch element is earlier than the turn-off time of the second switch element through the first driving circuit and the second driving circuit.

\* \* \* \* \*